(12) United States Patent
Takasu et al.

(10) Patent No.: US 6,320,242 B1
(45) Date of Patent: Nov. 20, 2001

(54) SEMICONDUCTOR DEVICE HAVING TRIMMABLE FUSES AND POSITION ALIGNMENT MARKER FORMED OF THIN FILM

(75) Inventors: Hiroaki Takasu; Noritoshi Ando; Yoshikazu Kojima; Kazunari Sugiura; Michiaki Yazawaw, all of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/176,339

(22) Filed: Oct. 21, 1998

(30) Foreign Application Priority Data

| Oct. 22, 1997 | (JP) | 9-290174 |
| Feb. 17, 1998 | (JP) | 10-034729 |
| Feb. 20, 1998 | (JP) | 10-039410 |
| Apr. 13, 1998 | (JP) | 10-101572 |
| Apr. 13, 1998 | (JP) | 10-101573 |
| Apr. 13, 1998 | (JP) | 10-101575 |
| Oct. 9, 1998 | (JP) | 10-288320 |

(51) Int. Cl.⁷ ................................................. H01L 29/00
(52) U.S. Cl. ..................... 257/529; 438/132; 356/401
(58) Field of Search ...................... 257/529; 356/401; 438/130, 132

(56) References Cited

U.S. PATENT DOCUMENTS

| 4,517,532 | * | 5/1985 | Neidorff | 331/57 |
| 4,774,561 | * | 9/1988 | Takagi | 257/529 |
| 5,528,372 | * | 6/1996 | Kawashima | 356/401 |
| 5,663,589 | * | 9/1997 | Saitoh et al. | 257/401 |
| 5,729,041 | * | 3/1998 | Yoo et al. | 257/529 |
| 5,879,966 | * | 3/1999 | Lee et al. | 438/132 |
| 5,965,927 | * | 10/1999 | Lee et al. | 257/529 |
| 5,986,320 | * | 11/1999 | Kawano | 257/529 |

FOREIGN PATENT DOCUMENTS

402065149 * 3/1990 (JP) ................................ H01L/21/66

* cited by examiner

*Primary Examiner*—Olik Chaudhuri
*Assistant Examiner*—Ginette Peralta
(74) *Attorney, Agent, or Firm*—Adams & Wilks

(57) ABSTRACT

In a semiconductor integrated circuit device having laser-trimmable fuses and a trimming position pattern, in order to increase trimming accuracy and reduce the size of the positioning pattern, the fuses and the positioning pattern are formed using the same thin film. The trimming positioning pattern has an abrupt boundary between a high light reflectivity region and a low reflectivity region so that light reflectivity varies abruptly. To further reduce size, the trimming positioning pattern can be formed in pad areas of a integrated circuit chip or placed at intersections between scribe lines in a wafer.

56 Claims, 19 Drawing Sheets

LASER PEAK

LASER ENERGY DISTRIBUTION
(GAUSSIAN DISTRIBUTION)

SEMICONDUCTOR DEVICE HAVING TRIMMABLE FUSES AND POSITION ALIGNMENT MARKER FORMED OF THIN FILM

BACKGROUND OF THE INVENTION

This invention relates to a semiconductor device which is provided with a positioning pattern for accurately cutting fuse elements formed on semiconductor chip surfaces by laser beam irradiation.

In analog semiconductor integrated circuit devices, there is known a laser trimming method for adjusting analog characteristics. For example, a description of such a method is made in Japanese Patent Laid open No. H5-13670. An integrated circuit is two-dimensionally patterned on a semiconductor wafer, and thereafter measurements are mad of various integrated circuit electric characteristics in a wafer state. Then fuse elements provided in interconnections are selected to adjust analog characteristics and cut by laser beam irradiation. The laser trimming method such as this can make adjustments of the integrated circuit analog characteristics into desired characteristics through selectively cutting the fuse elements. A positioning pattern is provided on a surface of the semiconductor wafer in order to irradiate a laser beam onto predetermined fuse elements. FIG. 3(a) is a plan view of a conventional positioning pattern, FIG. 3(b) is a sectional view of the conventional positioning pattern, and FIG. 3(c) is a diagram showing a variation in the light reflection amount where the positioning pattern is scanned over by irradiating a light beam along a C–C' line direction. The conventional positioning pattern comprising, as shown in FIG. 3(a), a so-called theta mark 301 provided in a scribe line area 203 to perform comparatively rough positioning in a semiconductor wafer rotating direction, and an X-direction trimming mark 302 and Y-direction trimming mark 303 for accurately positioning one by one semiconductor integrated circuit chips 201 placed in repetition. The theta mark 301 is desirably in a featured form different from that of the pad area 202 in the semiconductor integrated circuit chip 201 such that automatic recognition can be made.

Although a Γ-form was shown in the example in FIG. 3(a), another form may be satisfactory provided that it is in a featured form and recognition is easy to perform.

As shown in FIG. 3(b) the conventional positioning pattern is formed by a rectangular aluminum film 105 on a silicon-oxide first insulation film 102 provided on the silicon substrate 101. If a light beam is scanned over along a direction of a line C–C' in FIG. 3(a), a light reflection pattern as shown in FIG. 3(c) is obtained due to high reflectivity of the aluminum film 105. High light reflection amount is exhibited on the aluminum film 105, while the portion having no aluminum film 105 becomes low in light reflection amount. The position as a reference for trimming is grasped using a part where the light reflection amount varies between the high light reflection amount and the low light reflection amount. The positional relationship between the positioning pattern and the fuse element formed by a polysilicon film of the integrated circuit is determined during design. Accordingly, by irradiating a light beam onto the positioning pattern to detect a position where the light reflection amount varies, a coordinate of a desired fuse element is calculated. By irradiating laser to that site, the fuse elements can be selectively trimmed.

In the conventional laser trimming, however, the fuse elements and the positioning pattern are formed by different thin films, making possible to perform accurate positioning. Where a reference position is detected by a positioning pattern that is an aluminum pattern and then laser trimming is made on the polysilicon thin film as a fuse element, there occurs mis-alignment in laser irradiation area 32 with respect to the fuse element 31 as shown in FIG. 14 due to mis-registration occurring in the semiconductor process between the aluminum pattern and the elements formed by a polysilicon thin film. The laser irradiation area 32 is in an energy distribution of a Gaussian distribution, and low in energy intensity at a laser irradiation end. Consequently, if there is a mis-registration between the polysilicon film patterning and the aluminum film patterning during the wafer process, there arises a problem that stable cutting of the fuse elements becomes impossible. Incidentally, reference numeral 33 denotes burning in the underlying layer, and 34 denotes a portion left uncut of a fuse.

Also, in the conventional method the laser trimming positioning patterns are often placed in the scribe line area between the semiconductor integrated circuit chips. The scribe line area is a cutting allowance used for scribing (cutting) the semiconductor wafer. If there exist many films in this area, the dicing cutter edge might be damaged during dicing process, raising a problem that dicing process throughput is lowered and in an extreme case the semiconductor integrated circuit chip is damaged due to improper dicing.

Therefore, it is an object of this invention to provide a semiconductor device in which the fuse elements for the semiconductor chips can be accurately positioned and trimmed. Furthermore, it is an object of the present invention to enhance the trimming positioning accuracy thereby enabling reduction in size of the fuse element areas and hence cost.

It is another object to provide a semiconductor device with which no trouble is encountered in the dicing process by reducing the laser trimming positioning pattern area occupied in the scribe line area or introducing the laser trimming positioning pattern in the semiconductor integrated circuit chip.

SUMMARY OF THE INVENTION

In order to solve the problems the present invention adopted the following means.

(1) There is provided, in a semiconductor device having semiconductor integrated circuits arranged two-dimensionally placed in repetition in a matrix form through scribe lines on a surface of a semiconductor wafer, fuses to be cut by laser trimming provided on the semiconductor integrated circuits, and a laser trimming positioning pattern provided on the surface of the semiconductor wafer, the semiconductor device being characterized in that the laser trimming positioning pattern is structured by a thin film the same as that forming the fuse.

(2) A semiconductor device as recited in (1) is provided, wherein the laser trimming positioning pattern is formed by high light reflectivity regions and a low light reflectivity region sandwiched by the high light reflectivity regions. Pr conversely, a semiconductor device as recited in (1) is provided, wherein the laser trimming positioning pattern is formed by low light reflectivity regions and a high light reflectivity region sandwiched by the low light reflectivity regions.

(3) A semiconductor device as recited (2) is provided, wherein the low light reflectivity region is of dotted or lattice or stripe pattern for causing light diffused reflection.

(4) A semiconductor device as recited in (2) is provided, wherein laser trimming fuse elements are formed by a polysilicon thin film.

(5) There is provided, in a semiconductor device having the semiconductor integrated circuits arranged two-dimensionally in repetition in a matrix form through the scribe lines on a surface of the semiconductor wafer, the fuses provided on the semiconductor integrated circuits, and a laser trimming positioning pattern provided on the surface of the semiconductor wafer, the semiconductor device being characterized by comprising the laser trimming positioning pattern is formed by the high light reflectivity region and the low light reflectivity region, the high light reflectivity region being formed by a high light reflectivity film formed on a flat underlying layer, and the low light reflectivity region being formed by the high light reflectivity film formed on a dotted or lattice or stripe formed light diffusely reflective pattern structured by a same thin film as the fuse.

(6) A semiconductor device as recited in (5) is provided, wherein the laser trimming positioning pattern is formed by the high light reflectivity regions and the low light reflectivity region sandwiched by the high light reflectivity regions.

(7) A semiconductor device as recited in (5) is provided, wherein the laser trimming positioning pattern is formed by the low light reflectivity regions and the high light reflectivity region sandwiched by the low light reflectivity regions.

(8) A semiconductor device as recited in (5) is provided, wherein the fuse is structured by a polysilicon thin film.

(9) A semiconductor device as recited in (5) is provided, wherein the high light reflectivity film is structured of aluminum.

(10) A semiconductor device as recited in (5) is provided, wherein the laser trimming positioning pattern is placed in a pad area for electrical connection to the outside within the semiconductor integrated circuit chip.

(11) A semiconductor device as recited in (10) is provided, wherein the laser trimming positioning pattern is formed by a high light reflectivity region and a low light reflectivity region, the high light reflectivity region being formed by a high light reflectivity film formed on a flat underlying layer, the low light reflectivity region being formed by a high light reflectivity film formed on a lattice or stripe or dotted formed light diffusely reflective pattern structured by the same type of thin film as the laser trimming fuse element.

(12) A semiconductor device as recited in (11) is provided, wherein the laser trimming positioning pattern is formed by high light reflectivity regions and a low light reflectivity region surrounded by the high light reflectivity regions.

(13) A semiconductor device as recited in (11) is provided, wherein the laser trimming positioning pattern is formed by low light reflectivity regions and a high light reflectivity region surrounded by the low light reflectivity regions.

(14) A semiconductor device as recited in (11) is provided, wherein the laser trimming fuse element is structured by a polysilicon thin film.

(15) A semiconductor device as recited in (11) is provided, wherein the high light reflectivity film is formed of aluminum.

(16) A semiconductor device as recited in (5) is provided, wherein the laser trimming positioning pattern is placed at an intersection between the scribe lines.

(17) A semiconductor device as recited in (5) is provided, wherein the laser trimming positioning pattern is of a continuous structure useable both as a theta mark for comparatively rough positioning with respect to a rotating direction of the semiconductor wafer and a trimming mark for accurately one by one positioning of semiconductor integrated circuits placed in repetition.

(18) A semiconductor device that defines an inside dimension of the laser trimming positioning pattern as an index for a laser beam diameter in order to increase a difference (contrast) in light reflection amount between the high light reflectivity region and the low light reflectivity region.

EMBODIMENT OF THE INVENTION

A laser trimming positioning pattern comprises a high light reflectivity region and a low light reflectivity region. The boundary between the high light reflectivity region and the low light reflectivity region, that is, the area where light reflectivity sharply varies, is defined by a pattern formed by a thin film as the same type of laser-trimming fuse element. This enables accurate laser trimming to performed without mis-registration during the wafer process.

Also, the laser trimming positioning pattern may be arranged by transferring to a pad area for electrical connection between the inside and outside of the semiconductor integrated circuit chip from the scribe line area. Where forming in the scribe line area, a continuous structure may be provided which is used both as a theta mark for comparatively rough positioning with respect to a semiconductor wafer rotating direction and as a trimming mark for accurately positioning one by one semiconductor integrated circuits placed in repetition. The placement at an intersection between the scribe lines can reduce the area of the laser trimming positioning pattern occupied in the scribe line area.

Further, the size of the laser trimming positioning pattern is defined with a laser beam diameter as an index, in order to provide a great difference in reflectivity (to increase contrast) between the high light reflectivity region and the low light reflectivity region. Therefore a structure is obtainable that can fully exhibit the capability of the laser trimming positioning pattern.

The present invention will now be explained hereinbelow based on the drawings.

Incidentally, unless otherwise noted fuse elements for laser trimming are formed by a polysilicon thin film, though illustrations will be omitted in the following explanations in order for simplification.

Figure 1A:
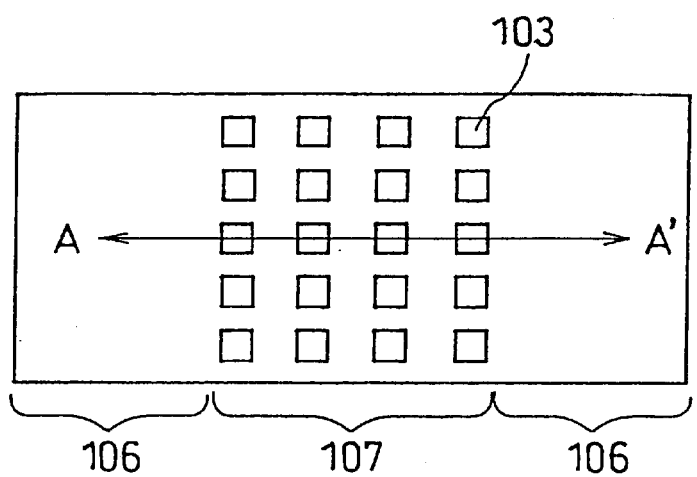
FIG. 1(a) is a plan view of a laser trimming positioning pattern of a semiconductor device of the present invention.
Figure 1B:
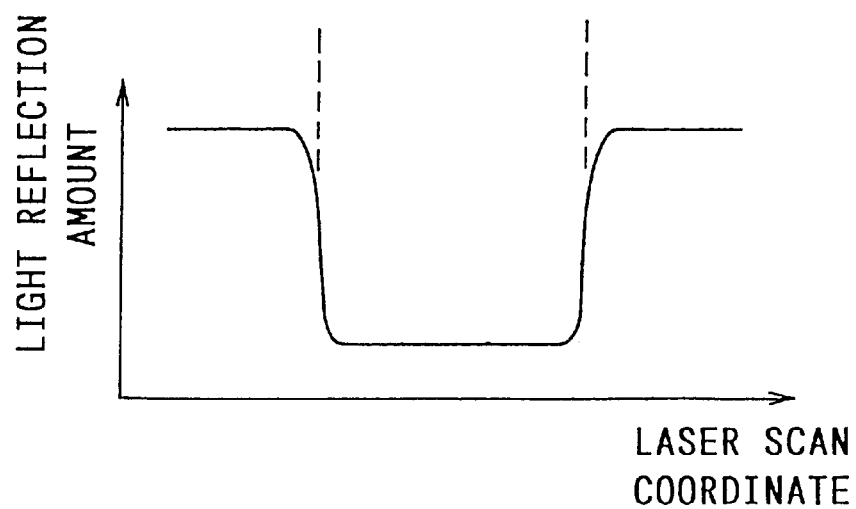
FIG. 1(b) is a diagram showing a light reflection amount along an A–A' line in FIG. 1(a).

FIG. 1(a) is a plan view of a positioning pattern of the present invention, while FIG 1(b) is a view showing a variation in light reflection amount when a light beam is scanned over the positioning pattern. The light reflection amount is a value where scanning is performed along an A–A' direction in FIG. 1(a). The positioning pattern of the present invention is structured by high light reflectivity regions 106 and a low light reflectivity region 107 on an inner side of them, as shown in FIG. 1(a). In the example of FIG. 1, a low light reflectivity region 107 was formed by utilizing the effect of light diffused reflection. A polysilicon thin film 103, which is the same thin film as a fuse element, was formed in a dot form so as to cause diffused reflection. To cause diffused reflection, a pattern may be in a lattice form, stripe form or the like rather than the dotted form, by which is obtained a light reflection pattern as shown in FIG. 1(b). The fuse elements are preferably of a film that is easy to absorb light and ready to cut. A preferred film is a polysilicon film. The polysilicon film is easy to absorb light and readily cut by laser irradiation. By forming a polysilicon film 103 into a dotted-form pattern shown in FIG. 1(a) to provide a low light reflectivity region 107 on an inner side of the positioning pattern, it becomes possible to obtain contrast having a great light reflection amount. The high light reflectivity region 106 can be structured, as in the conventional, by field areas formed by an oxide film or the like on the semiconductor substrate.

Figure 2A:
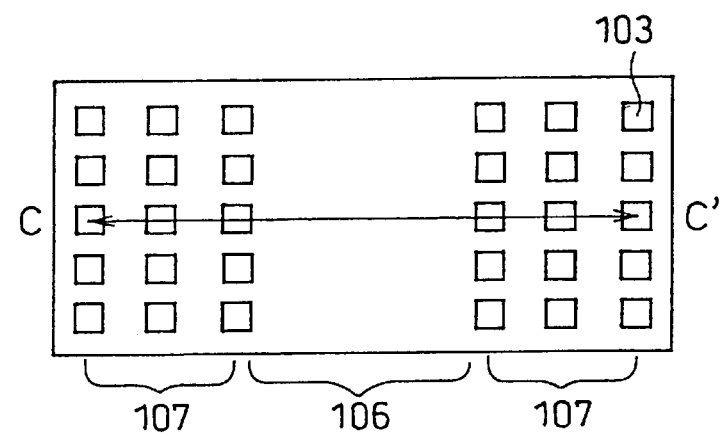
FIG. 2(a) is a plan view of a laser trimming positioning pattern of second embodiment of a semiconductor device of the present invention.
Figure 2B:
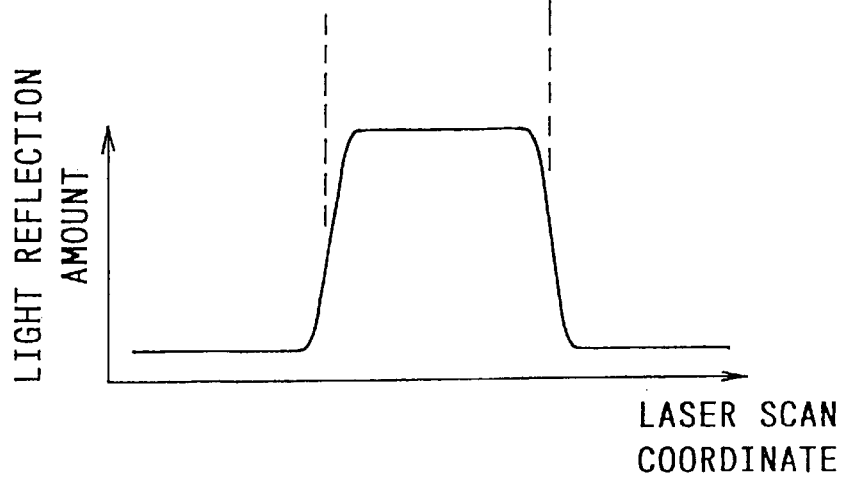
FIG. 2(b) is a diagram showing a light reflection among along a C–C' line in FIG. 3(a).

FIG. 2(a) is a plan view of a positioning pattern in a second embodiment of the present invention, while FIG 2(b) is a diagram showing a variation in light reflection amount where a light beam is scanned over. The light reflection amount is a value where scan is performed along a C–C' direction in FIG. 2(a). The positioning pattern of the present invention is structured by low light reflectivity regions 107 and a high light reflectivity region 106 on an inner side thereof, as shown in FIG. 2(a), which is reversibly structured to the example shown in FIG. 1(a). The laser trimming positioning pattern may be satisfactory if either one of the low light reflectivity region 107 or the high light reflectivity region 106 sandwich the other therebetween, allowing the structure as in FIG. 2(a). As for other points, same reference characters as those in FIG. 1 are used to omit a repetitive explanation.

Figure 4A:
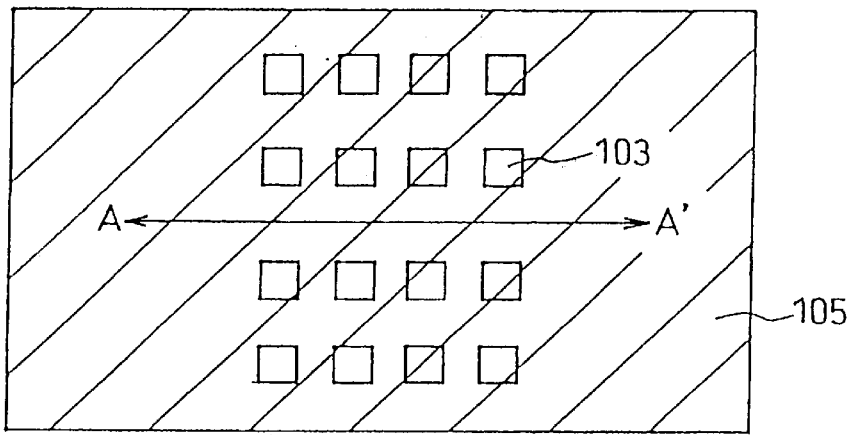
FIG. 4(a) is a plan view of a laser trimming positioning pattern of a third embodiment of a semiconductor device of the present invention.
Figure 4B:
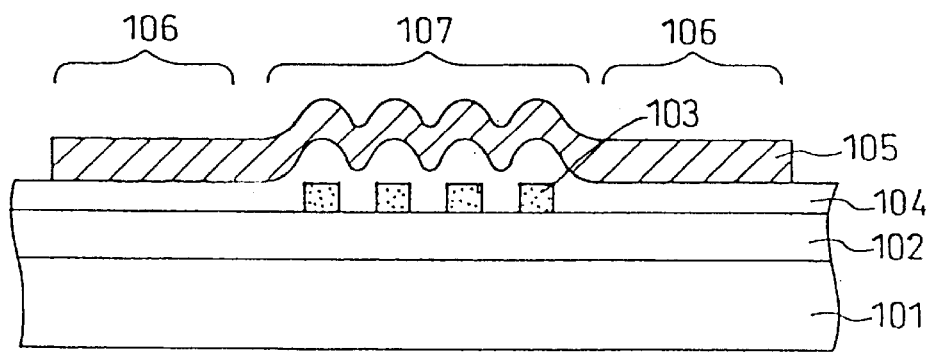
FIG. 4(b) is a sectional view of the laser trimming positioning pattern of the third embodiment of the semiconductor device of the present invention.
Figure 4C:
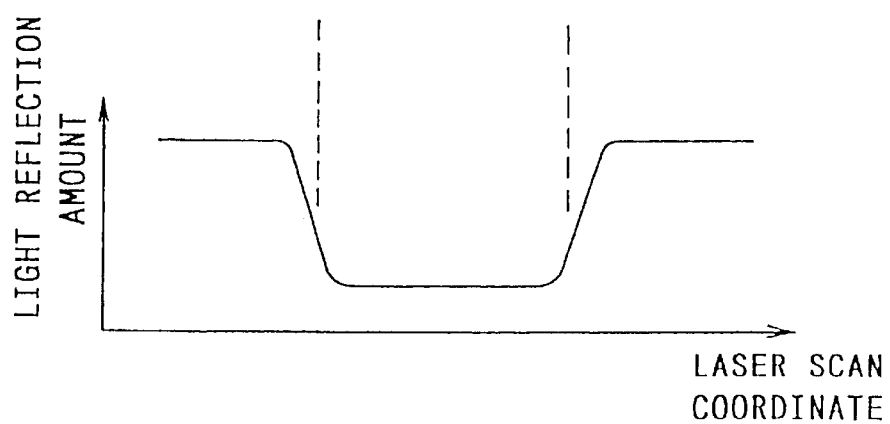
FIG. 4(c) is a diagram showing a light reflection amount along an A–A' line in FIG. 4(a).

FIG. 4(a) is a plan view of a positioning pattern in a third embodiment of the present invention, FIG. 4(b) is a sectional view of a positioning pattern of the third embodiment of the present invention, and FIG. 4(c) is a diagram showing a variation in light reflection amount where a light beam is scanned over the positioning pattern of the third embodiment. The light reflection amount is a value where scan is performed along an A–A' direction of FIG. 4(a). The positioning pattern in the third embodiment of the present invention is structured by high light reflectivity regions 106 and a low light reflectivity region 107 on an inner side thereof, as shown in FIG. 4(b).

The structure of the positioning pattern of the present invention will be explained using FIG. 4(a) and FIG. 4(b).

A first insulation film 102 of a silicon oxide film or the like is formed on a silicon substrate 101. On the first insulation film 102 a dotted-formed polysilicon thin film 103 is formed. At an area that no polysilicon thin film 103 is formed, the flat first insulation film 102 is exposed. A second insulation film 104 of a PSG film or the like is formed thereon, and an aluminum film 105 is formed on the second insulation film 104. The aluminum film 105 at its surface, positioned above the area that is formed with the dotted-form polysilicon thin film 103, is roughened by the effect of the polysilicon thin film 103 pattern. The light irradiated onto this area is diffusely reflected. Consequently, this area can be provided as a low light reflectivity region 107. On the other hand, the aluminum film 105 has a flat surface above areas where no polysilicon thin film 103 is formed, which can be provided as high light reflectivity regions 106.

Where a light beam is scanned in a direction along a line A–A' in FIG. 4(a), as shown in FIG. 4(c), the light reflection amount is great at the high light reflectivity regions 106 formed by the aluminum film 105 with the flat surface, and small at the low light reflectivity region 107 formed by the aluminum film 105 with the roughened surface.

In the examples of FIGS. 4(a), (b) and (c), the low light reflectivity regions 107 were formed by utilizing the effect of light diffused reflection. In order to cause light diffused reflection, the dot-form patterns were formed by the polysilicon thin film 103 that is the same film as the fuse elements. It is possible to cause light diffused reflection also by a pattern, such as of a lattice form or stripe form, other than the dotted-form, thereby obtaining a light reflection pattern as in FIG. 4(c).

The first insulation film 102 and the second insulation film 104 in FIG. 4(b) are not necessarily required and may be omitted as the case may be. Also, in place of the aluminum film 105, a metal material such as tungsten and chromium may be employed for a high reflectivity film.

As stated above, the high light reflectivity region 106 and the low light reflectivity region 107 have a boundary that is determined by a pattern of the polysilicon thin film 103 as the same thin film material as fuse elements. This therefore eliminates the problem, as encountered in the conventional positioning pattern, due to misalignment between the polysilicon for forming fuse element and the aluminum pattern for forming a positioning pattern.

Figure 5A:
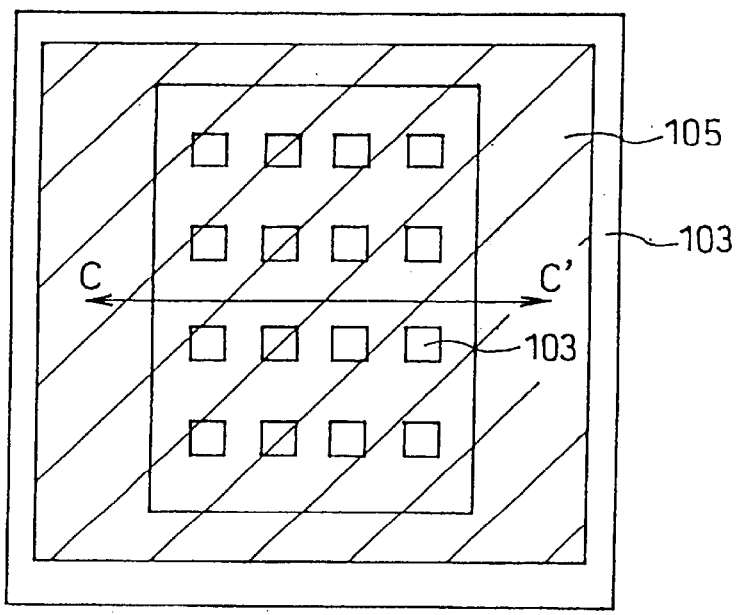
FIG. 5(a) is a plan view of a laser trimming positioning pattern of fourth embodiment of a semiconductor device of the present invention.
Figure 5B:
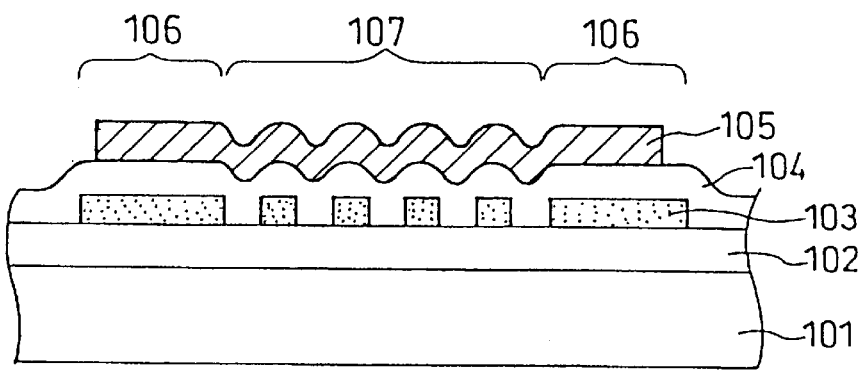
FIG. 5(b) is a sectional view of the laser trimming positioning pattern of the fourth embodiment of the semiconductor device of the present invention.
Figure 5C:
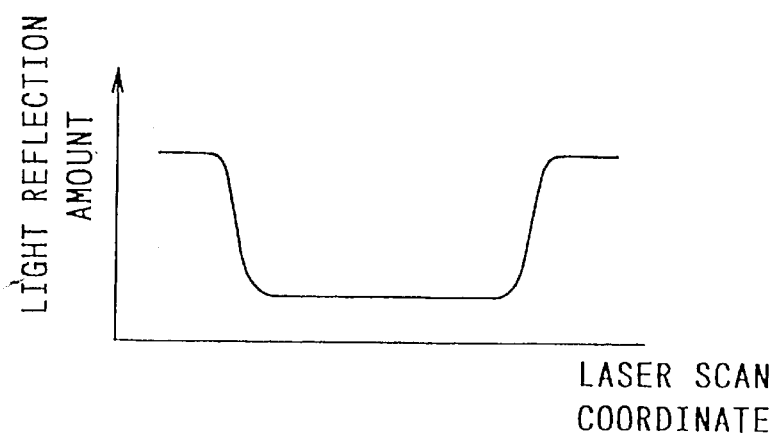
FIG. 5(c) is a diagram showing a light reflection amount along a C–C' line in FIG. 5(a).

FIG. 5(a) is a plan view of a positioning pattern in a fourth embodiment of a semiconductor device of the present invention, FIG. 5(b) is a sectional view of a positioning pattern of the fourth embodiment of the semiconductor device of the present invention, and FIG. 5(c) is a diagram showing a variation in light reflection amount where a light beam is scanned over the positioning pattern of the fourth embodiment of the semiconductor device of the present invention. The light reflection amount is a value where scan is performed along a direction of a line C–C' in FIG. 5(a). The positioning pattern of the fourth embodiment of the present invention is structured by a high light reflectivity regions 106 and a low light reflectivity region 107 on an inner side thereof, similarly to the third embodiment shown in FIGS. 4(a) to (c).

The difference from the third embodiment shown in FIG. 4 lies in that the high light reflectivity region 106 is formed by an aluminum film 105 located above a flat polysilicon thin film 103. If the high light reflectivity region 106 is formed by a high reflectivity film on a flat underlying layer, its effect can be achieved. Hence such a structure is possible. Other explanations are omitted by putting the same reference characters as those of FIGS. 4(a) to (c).

Figure 6A:
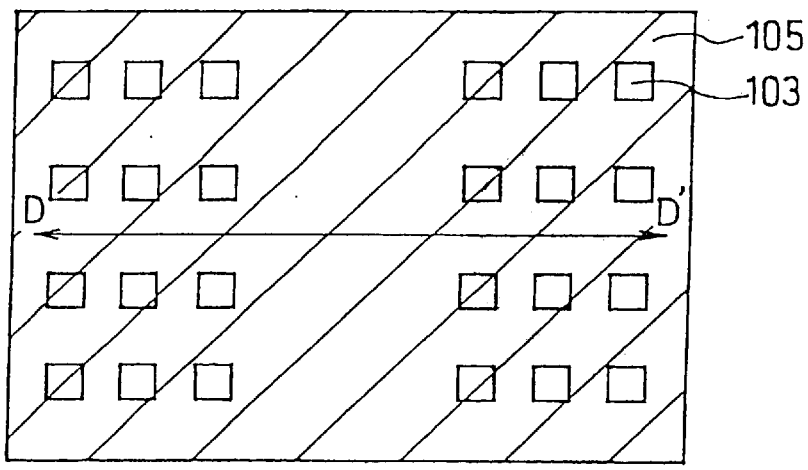
FIG. 6(a) is a plan view of a laser trimming positioning pattern of a fifth embodiment of a semiconductor device of the present invention.
Figure 6B:
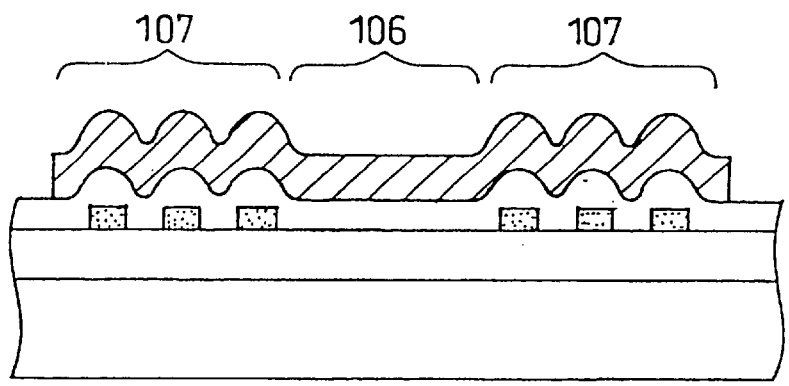
FIG. 6(b) is a sectional view of the laser trimming positioning pattern of the fifth embodiment of the semiconductor device of the present invention.
Figure 6C:
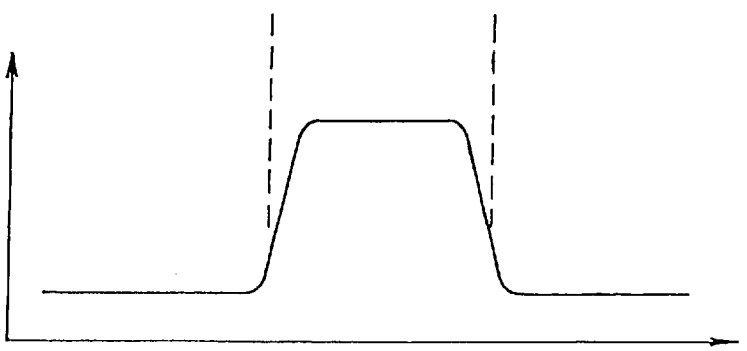
FIG. 6(c) is a diagram showing a light reflection amount along a D–D' line in FIG. 6(a).

FIG. 6(a) is a plan view of a positioning pattern in a fifth embodiment of a semiconductor device of the present invention, FIG. 6(b) is a sectional view of a positioning pattern of the fifth embodiment of the semiconductor device of the present invention, and FIG. 6(c) is a diagram showing a variation in light reflection amount where a light beam is scanned over the positioning pattern of the fifth embodiment of the semiconductor device of the present invention. The light reflection amount is a value where scan is performed along a direction of a D–D' line in FIG. 6(a). The positioning pattern in the fifth embodiment of the present invention is structured by arranging low light reflectivity regions 107 on outer sides and a high light reflectivity region 106 on an inner side thereof. The positioning pattern may take a form that either one of the high light reflectivity region 106 or the low light reflectivity region 107 is sandwiched between the other regions. The fifth embodiment shown in FIGS. 6(a) to (c) shows a case that is reverse in arrangement to the third embodiment shown in FIGS. 4(a) to (c), representing that such a form may be satisfactory. Other explanations are omitted by putting the same reference characters as those of FIGS. 4(a) to (c).

Figure 7A:
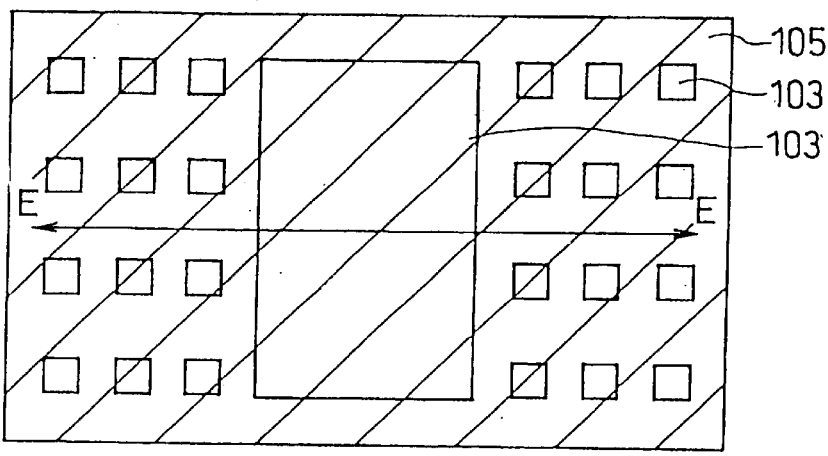
FIG. 7(a) is a plan view of a laser trimming positioning pattern of a sixth embodiment of a semiconductor device of the present invention.
Figure 7B:
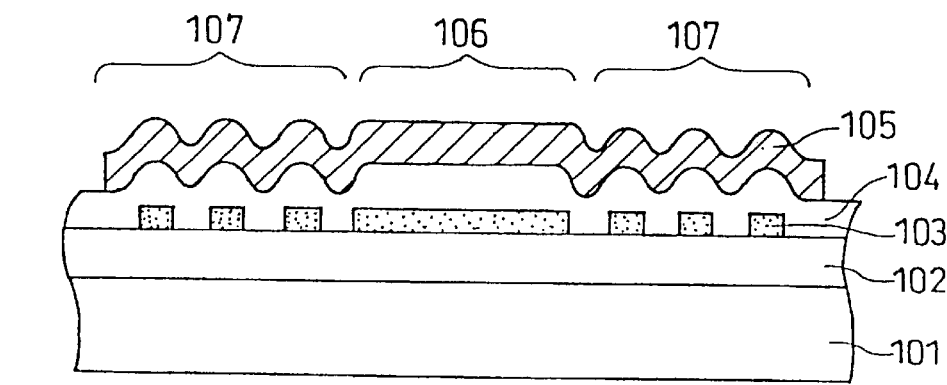
FIG. 7(b) is a sectional view of the laser trimming positioning pattern of the sixth embodiment of the semiconductor device of the present invention.
Figure 7C:
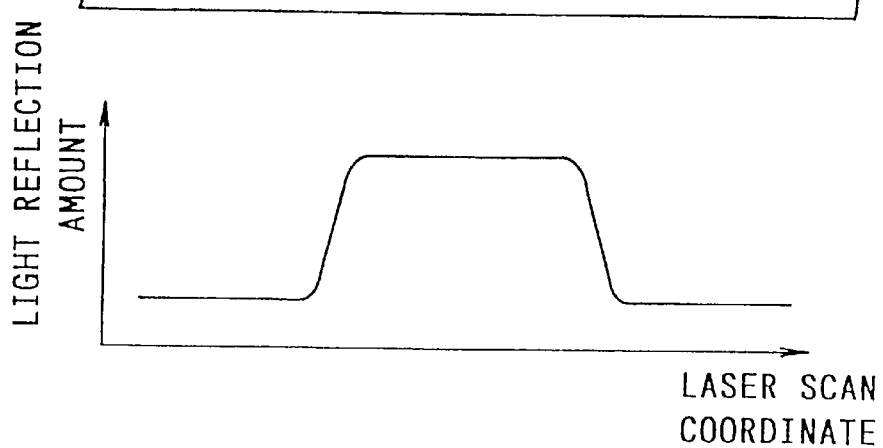
FIG. 7(c) is a diagram showing a light reflection amount along an E–E' line in FIG. 7(a).

FIG. 7(a) is a plan view of a positioning pattern in a sixth embodiment of a semiconductor device of the present invention, FIG. 7(b) is a sectional view of a positioning pattern of the sixth embodiment of the semiconductor device of the present invention, and FIG. 7(c) is a diagram showing a variation in light reflection amount where a light bean is scanned over the positioning pattern of the sixth embodiment of the semiconductor device of the present invention. The light reflection amount is a value where scan is performed along a direction of a E–E' line in FIG. 7(a). The positioning pattern in the sixth embodiment of the present invention is structured by arranging low light reflectivity regions 106 on outer sides and a high light reflectivity region 107 on an inner side thereof.

The positioning pattern may take a form that either one of the high light reflectivity region 106 or the low light reflectivity region 107 is sandwiched between the other regions, similarly to the explanation on the fifth embodiment. The sixth embodiment shown in FIGS. 7(a) to (c) shows a case that is reverse in arrangement to the fourth embodiment shown in FIGS. 5(a) to (c). Other explanations are omitted by putting the same reference characters as those of FIGS. 4(a) to (c).

The first insulation film 102 and the second insulation film 104 in FIG. 4 to FIG. 7 are not necessarily required, and may be omitted as the case may be. Also, in place of the aluminum film 10, a metal material such as tungsten, chromium and gold may be used for a high reflectivity film.

Figure 8A:
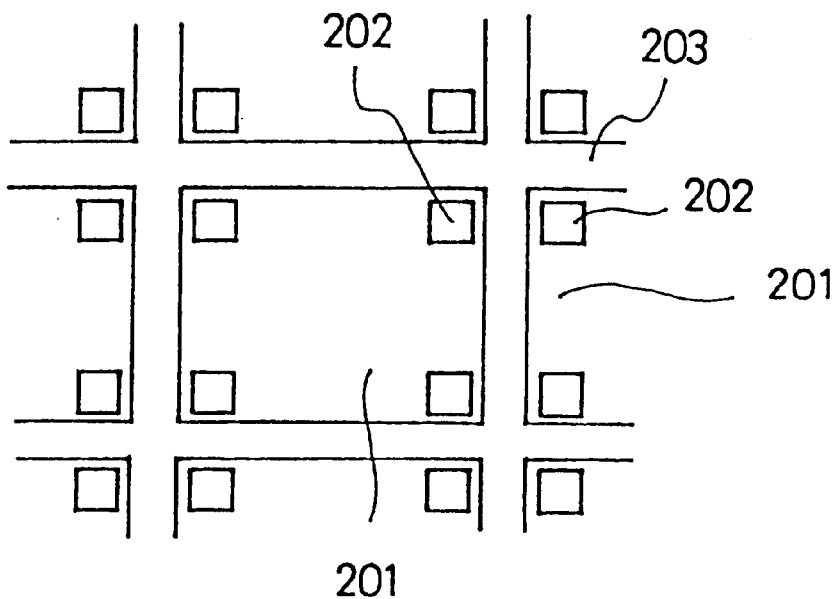
FIG. 8(a) is a typical plan view of a semiconductor integrated circuit chip including a laser trimming positioning pattern of a seventh embodiment of a semiconductor device according to the present invention.
Figure 8B:
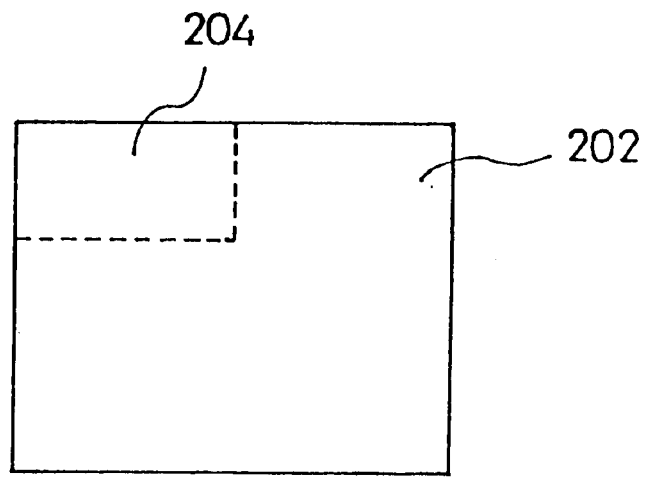
FIG. 8(b) is a typical plan view magnifying a pad area arranged with a laser trimming positioning pattern of FIG. 8(a).

FIG. 8(a) is a typical plan view of a semiconductor integrated circuit chip having a positioning pattern according to seventh to tenth embodiments of a semiconductor device of the present invention. FIG. 8(b) is a typical plan view magnifying a pad area arranged in a laser trimming positioning pattern in FIG. 8(a).

As shown in FIG. 8(a), in the semiconductor integrated circuit chip 201 pad areas 202 are arranged which are formed by a conductive thin film such as of aluminum for electrical connection to the outside. Also, the adjacent semiconductor chips 201 have a scribe line area 203 provided therebetween.

Here, the laser trimming positioning pattern according to the present invention is formed within the pad area 202.

FIG. 8(b) is a plan view showing a pad area 202 incorporating a laser trimming positioning pattern 204 according to the present invention. In FIG. 8(b), the pad area 202 has as its part a laser trimming positioning pattern 204.

The pad area 202 in its nature is an area required for being electrically connected to the outside. Because the laser trimming positioning pattern area 204 is formed inside the pad area 202, the laser trimming positioning pattern 204 can be introduced in the semiconductor integrated circuit chip without increasing the area of the semiconductor integrated circuit chip.

In FIGS. 8(a) and (b), the example was shown that one laser trimming positioning pattern 204 is formed in one pad area 202. However, if required, a plurality of laser trimming positioning patterns 204 may be formed in one pad area 202. One or a plurality of laser trimming positioning pattern 204 may be formed in a plurality of pad areas 202.

Now explanations will be made with greater detail on the laser trimming positioning pattern according to the present invention, using FIG. 9 to FIG. 12.

Figure 9A:
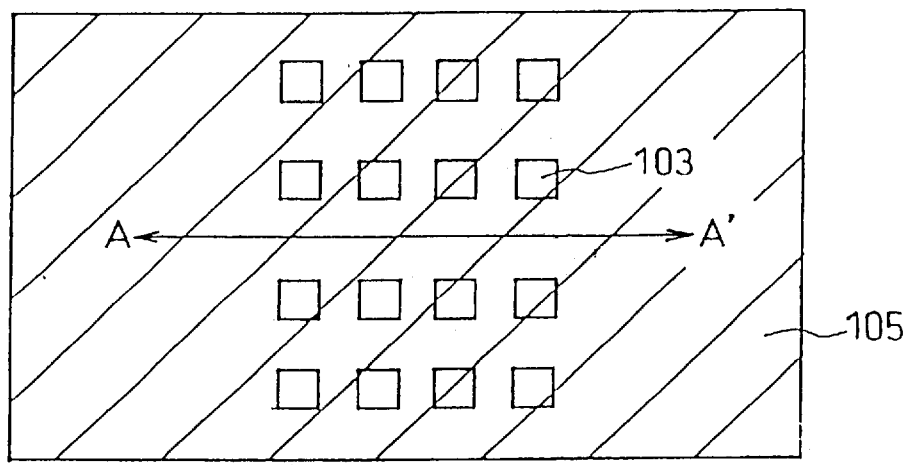
FIG. 9(a) is a plan view of a laser trimming positioning pattern of a seventh embodiment of the semiconductor device of the present invention.
Figure 9B:
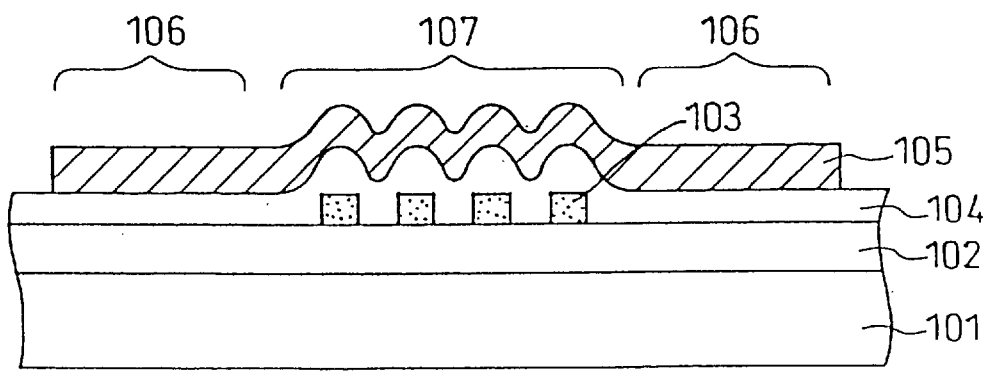
FIG. 9(b) is a sectional view of the laser trimming positioning pattern of the seventh embodiment of the semiconductor device of the present invention.
Figure 9C:
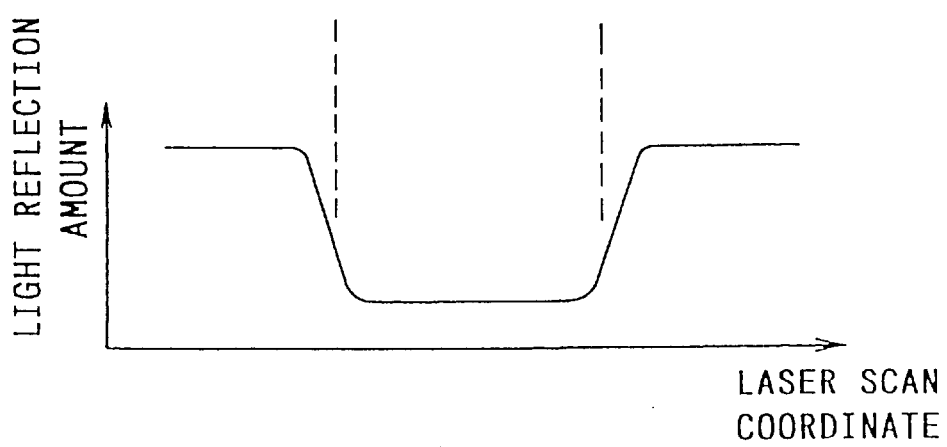
FIG. 9(c) is a diagram showing a light reflection amount along an A–A' line in FIG. 9(a).

FIG. 9(a) is a plan view of a laser trimming positioning pattern in a seventh embodiment of a semiconductor device of the present invention, FIG. 9(b) is a sectional view of a laser trimming positioning pattern of the seventh embodiment of the semiconductor device of the present invention, and FIG. 9(c) is a view showing a variation in light reflection amount where a light beam is scanned over the laser trimming positioning pattern of the seventh embodiment of the semiconductor device of the present invention. The light reflection amount is a value where scan is performed along a direction of an A–A' line in FIG. 9(a). As shown in FIG. 9(b), the laser trimming positioning pattern in the seventh embodiment of the present invention is structured by high light reflectivity regions 106 and a low light reflectivity region 107 on an inner side thereof.

Using FIG. 9(a) and FIG. 9(b), the structure of the laser trimming positioning pattern will be explained.

A first insulation film 102 of a silicon oxide film or the like is formed on a silicon substrate 101. On the first insulation film 102, a polysilicon thin film 103 is partly formed in a dotted form. In the area where no polysilicon thin film 103 is formed, a first insulation film 102 is exposed. A second insulation film 104 of a PSG film or the like is formed thereon, and an aluminum film 105 is formed on the second insulation film 104. The aluminum film 105 at its surface, located above the area formed with dotted polysilicon thin film 103, is roughened by the effect of the polysilicon thin film 103 pattern so that the light irradiated onto this area is diffusely reflected. Consequently, this area is provided as a low light reflectivity region 107. On the other hand, the surface of the aluminum film 105 is flat at an area that no polysilicon thin film 103 is formed, which may be provided as a high light reflectivity region 106.

Where a light beam is scanned along a direction of a line A–A' in FIG. 9(a), as shown in FIG. 9(c), the light reflection amount is great in the high light reflectivity region 106 formed by an aluminum film 105 with a flat surface and small in the low light reflectivity region 107 formed by the aluminum film 105 with a roughened surface.

Figure 3A:
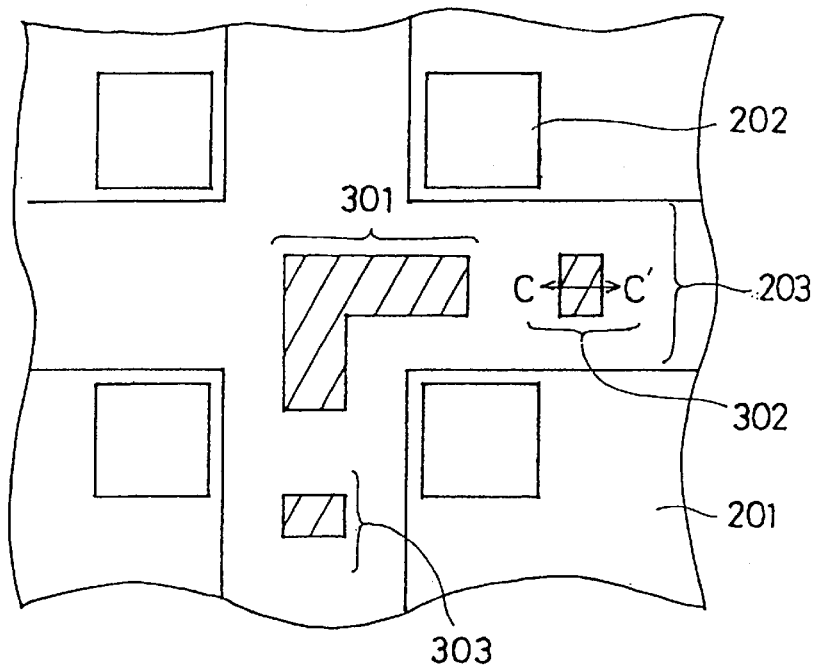
FIG. 3(a) is a plan view of a laser trimming positioning pattern of a conventional semiconductor device
Figure 3B:
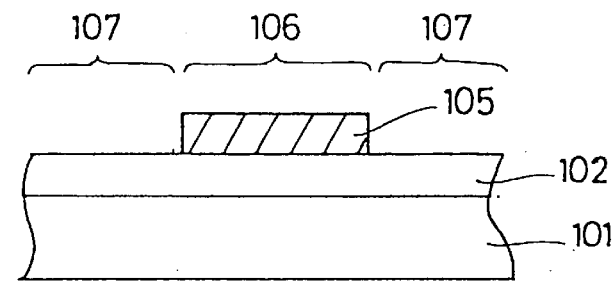
FIG. 3(b) is a diagram showing a light reflection amount along a B–B' line in FIG. 3(a) and FIG. 3(c) is a diagram showing a light reflection amount along a C–C' line in FIG. 3(a).
Figure 3C:
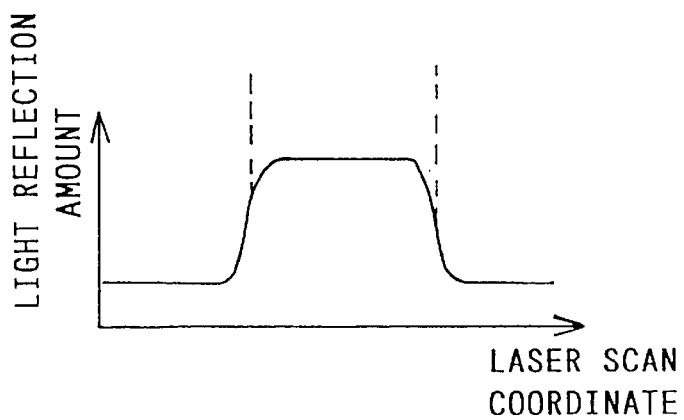

In the examples of FIGS. 9(a), 9(b) and 9(c), the low light reflectivity regions 107 were formed by utilizing a light diffused reflection effect. In order to cause light diffused reflection, dotted-form patterns were formed by a polysilicon thin film 103 that is the same thin film as fuse elements. It is also possible to cause light diffused reflection by a lattice form or stripe form pattern, obtaining a light reflection pattern as in FIG. 3(c).

Either one of the first insulation film 102 or the second insulation film 104 in FIG. 9(b) is not necessarily required, and may be omitted as the case may be. Also, where the laser trimming positioning pattern 204 is arranged within the pad area 202 that can be provided at the same potential as the aluminum film 105 and the silicon substrate 101 are electrically connected. Also, where a laser trimming positioning pattern 204 is placed in the pad area where the potential may be the same as the silicon substrate 101, the first insulation film 102 and the second insulation film 104 may be omitted to provide a form that the aluminum film 105 and the silicon substrate 101 are electrically connected. Also, in place of the aluminum film 105, a metal material such as tungsten, chromium and gold may be used as a high reflectivity film provided that it meets the application of electrical connection to the outside.

As stated above, the high light reflectivity region 106 and the low light reflectivity region 107 has a boundary determined by the pattern of the polysilicon thin film 103 that is the same thin film material as fuse elements. It is therefore possible to eliminate the problem, as encountered in the conventional laser trimming positioning pattern, of misalignment between the polysilicon for forming fuse elements and the aluminum film for forming a laser trimming positioning pattern.

Figure 10A:
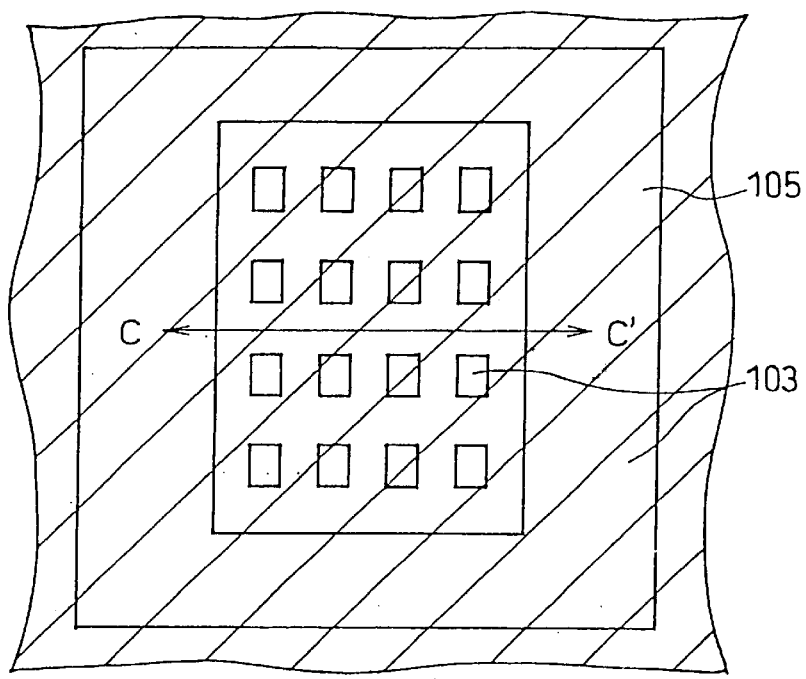
FIG. 10(a) is a plan view of a laser trimming positioning pattern of an eighth embodiment of the semiconductor device of the present invention.
Figure 10B:
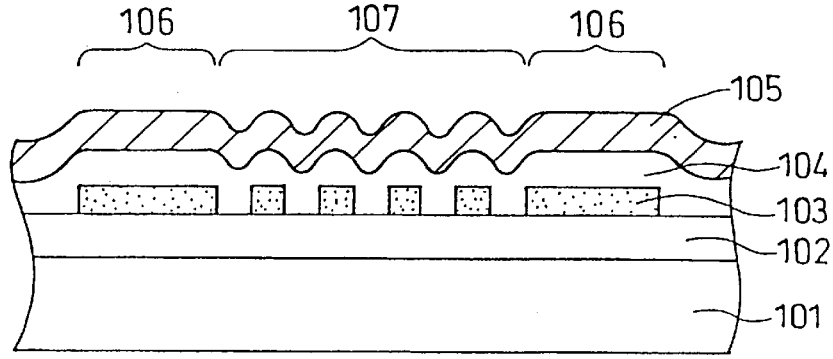
FIG. 10(b) is a sectional view of the laser trimming positioning pattern of the eighth embodiment of the semiconductor device of the present invention.
Figure 10C:
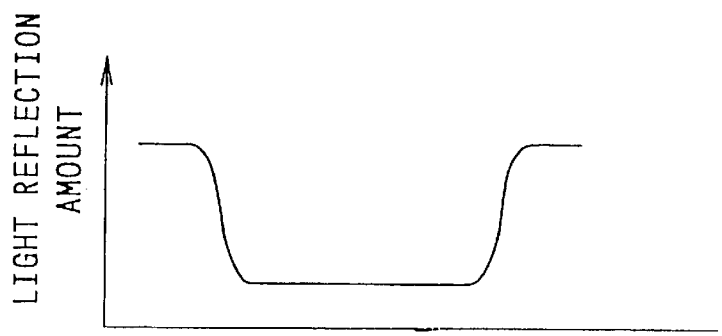
FIG. 10(c) is a diagram showing a light reflection amount along a C–C' line in FIG. 10(a).

FIG. 10(a) is a plan view of a laser trimming positioning pattern in an eighth embodiment of a semiconductor device of the present invention, FIG. 10(b) is a sectional view of a laser trimming positioning pattern of the eighth embodiment of the semiconductor device of the present invention, and FIG. 10(c) is a view showing a variation in light reflection amount where a light beam is scanned over the laser trimming positioning pattern of the eighth embodiment of the semiconductor device of the present invention. The light reflection amount is a value where scan is performed along a direction of an C–C' line in FIG. 10(a). The laser trimming positioning pattern in the eighth embodiment of the present invention is structured by high light reflectivity regions 106 and a low light reflectivity region 107 on an inner side thereof, similarly to the embodiments shown in FIGS. 9(a) to (c).

The difference from the seventh embodiment lies in that the high light reflectivity region 106 is formed by an aluminum film 105 located above a flat polysilicon thin film 103. Such a structure is possible because the high light reflectivity region 106 can achieve its role if it is formed by a high reflectivity film on a flat underlying layer. Other explanations will be omitted by putting the same reference characters as those of FIGS. 9(a) to (c).

Figure 11A:
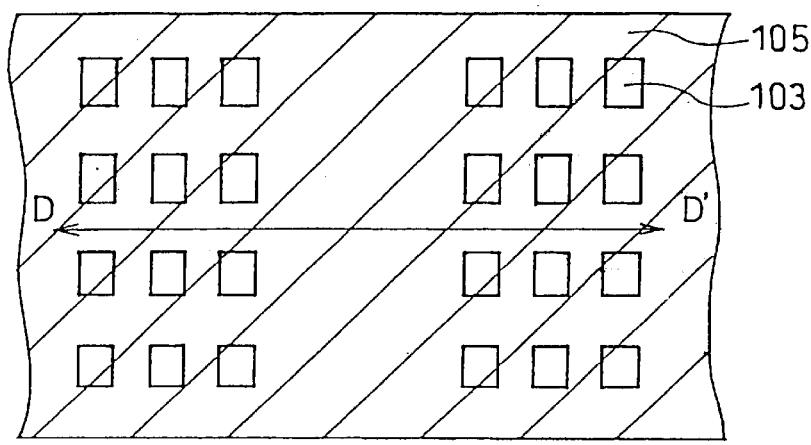
FIG. 11(a) is a plan view of a laser trimming positioning pattern of a ninth embodiment of a semiconductor device of the present invention.
Figure 11B:
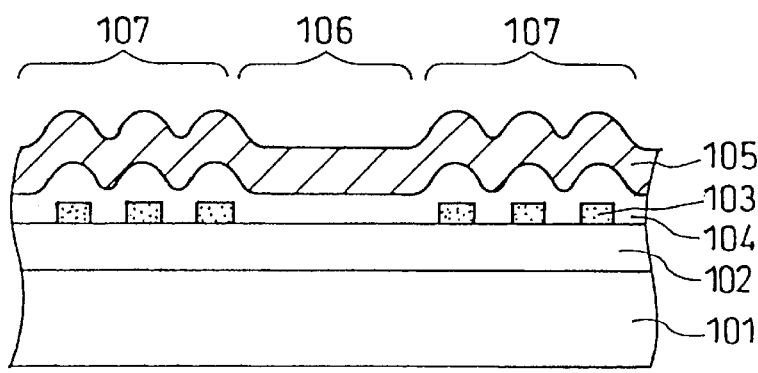
FIG. 11(b) is a sectional view of the laser trimming positioning pattern of the ninth embodiment of the semiconductor device of the present invention.
Figure 11C:
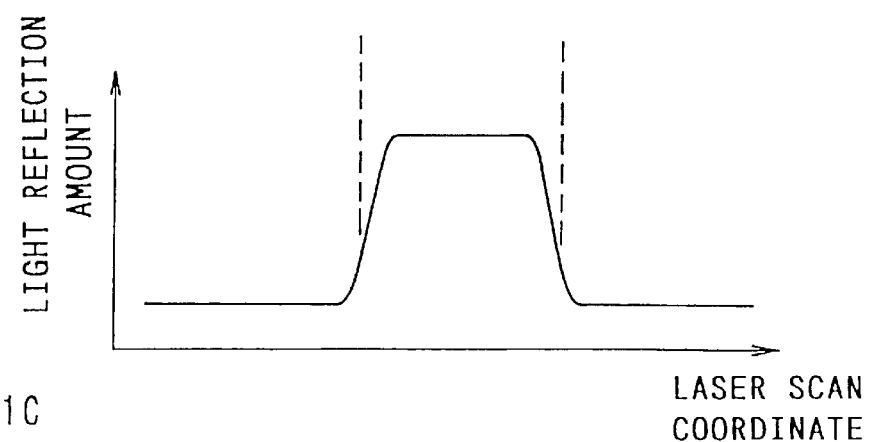
FIG. 11(c) is a diagram showing a light reflection amount along a D–D' line in FIG. 11(a).

FIG. 11(a) is a plan view of a laser trimming positioning pattern in a ninth embodiment of a semiconductor device of the present invention, FIG. 11(b) is a sectional view of a laser trimming positioning pattern of the ninth embodiment of the semiconductor device of the present invention, and FIG. 11(c) is a view showing a variation in light reflection amount where a light beam is scanned over the laser trimming positioning pattern of the ninth embodiment of the semiconductor device of the present invention. The light reflection amount is a value where scan is performed along a direction of a D–D' line in FIG. 11(a). The laser trimming positioning pattern in the ninth embodiment of the present invention is structured by arranging low light reflectivity regions 107 on the outer sides and a high light reflectivity region 106 on an inner side thereof. The laser trimming positioning pattern may take a form that either one of the high light reflectivity region 106 or the low reflectivity area 107 is sandwiched by the other regions. The ninth embodiment shown in FIGS. 11(a) to (c) represent the case reverse in arrangement to the seventh embodiment shown in FIGS. 9(a) to (c), showing the possibility of this arrangement. Other explanations will be omitted by putting the same reference characters as those of FIGS. 3(a) to (c).

Figure 12A:
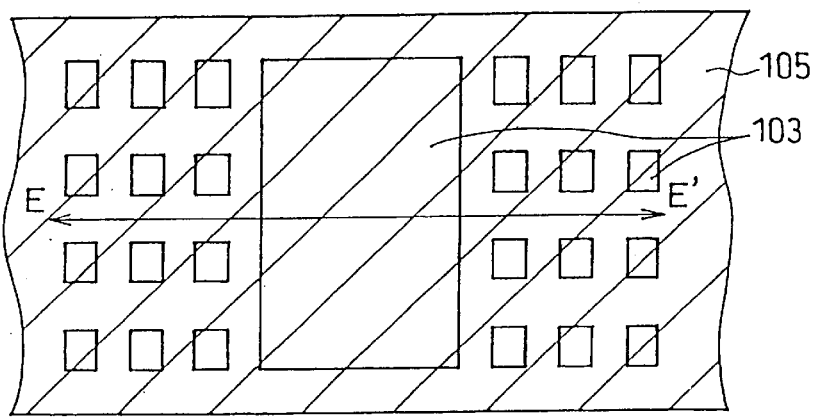
FIG. 12(a) is a plan view of a laser trimming positioning pattern of a tenth embodiment of a semiconductor device of the present invention.
Figure 12B:
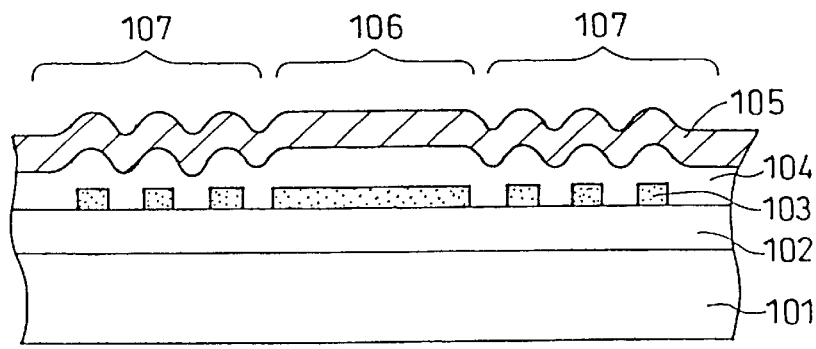
FIG. 12(b) is a sectional view of the laser trimming positioning pattern of the tenth embodiment of the semiconductor device of the present invention.
Figure 12C:
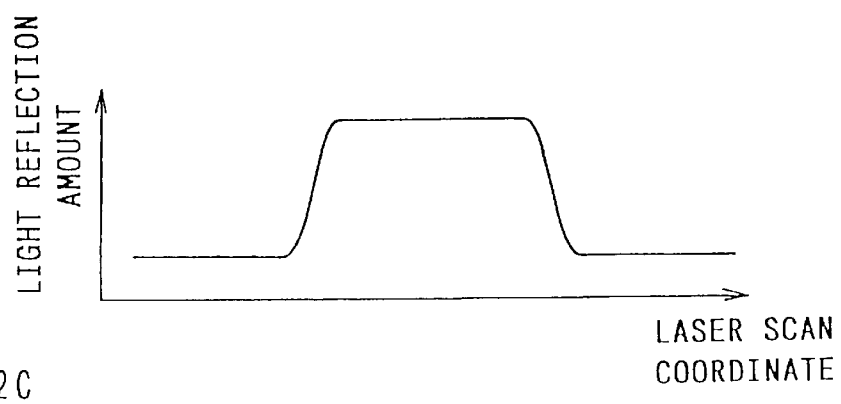
FIG. 12(c) is a diagram showing a light reflection amount along an E–E' line in FIG. 12(a).

FIG. 12(a) is a plan view of a laser trimming positioning pattern in a tenth embodiment of a semiconductor device of the present invention, FIG. 12(b) is a sectional view of a laser trimming positioning pattern of the tenth embodiment of the semiconductor device of the present invention, and FIG. 12(c) is a view showing a variation in light reflection amount where a light beam is scanned over the laser trimming positioning pattern of the tenth embodiment of the semiconductor device of the present invention. The light reflection amount is a value where scan is performed along a direction of an E–E' line in FIG. 12(a). The laser trimming positioning pattern in the tenth embodiment of the present invention is structured by arranging low light reflectivity regions 107 on the outer sides and a high light reflectivity region 106 on an inner side thereof.

The laser trimming positioning pattern may take a form that either one of the high light reflectivity region 106 or the low reflectivity area 107 is sandwiched by the other regions, similarly to the explanation on the eighth embodiment. The tenth embodiment shown in FIGS. 12(a) to (c) represent the case reverse in arrangement to the eighth embodiment shown in FIGS. 10(a) to (c), showing the possibility of this arrangement. Other explanations will be omitted by putting the same reference characters as those of FIGS. 9(a) to (c).

Figure 13A:
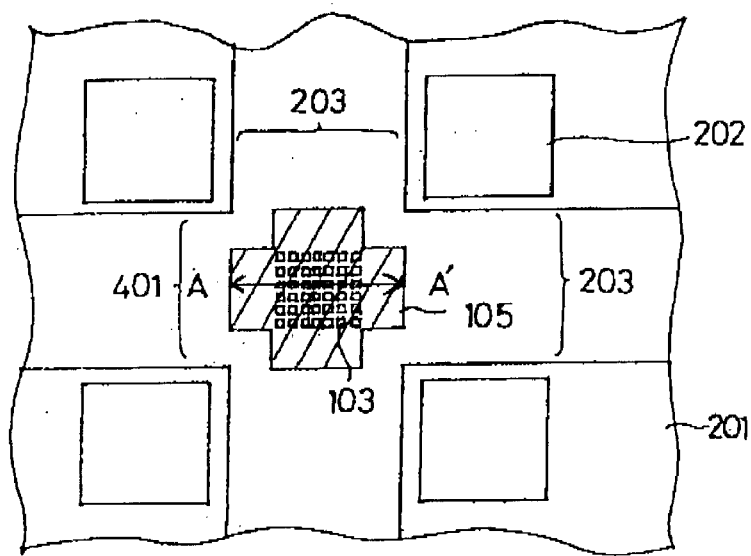
FIG. 13(a) is a plan view of a laser trimming positioning pattern of an eleventh embodiment of a semiconductor device of the present invention.
Figure 13B:
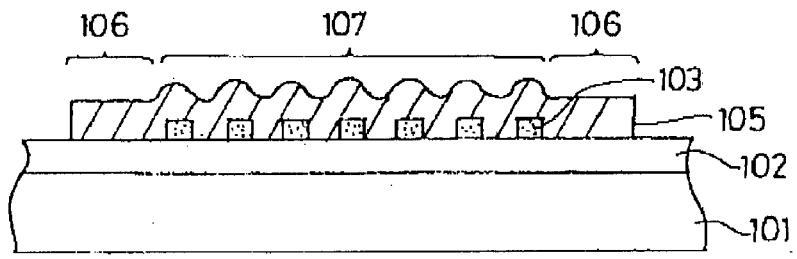
FIG. 13(b) is a sectional view of the laser trimming positioning pattern of the eleventh embodiment of the semiconductor device of the present invention.
Figure 13C:
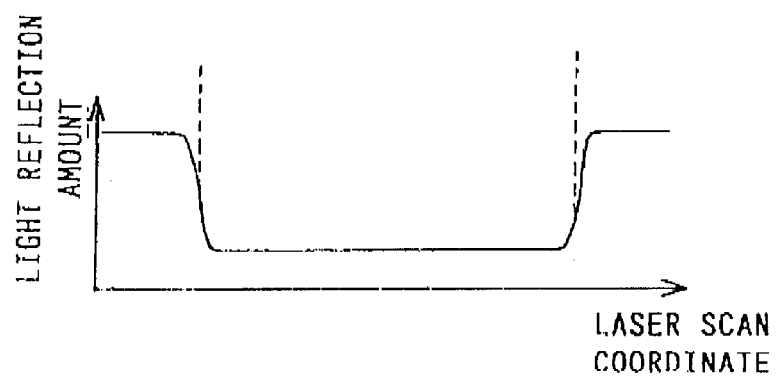
FIG. 13(c) is a diagram showing a light reflection amount along an A–A' line in FIG. 13(c).
Figure 14:
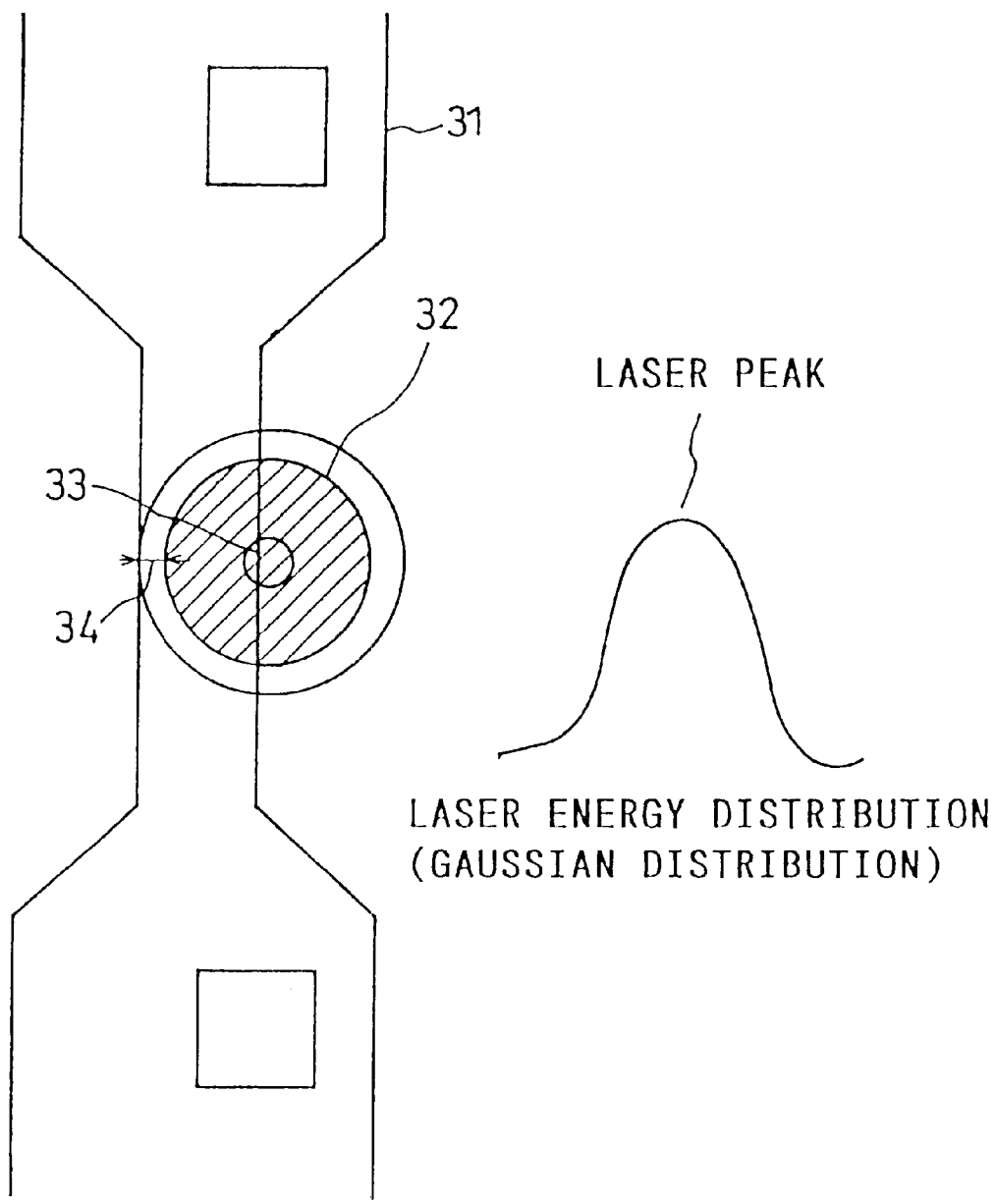
FIG. 14 is a plan view of a fuse element of a conventional semiconductor device.

FIG. 13(a) is a plan view of a positioning pattern in an eleventh embodiment of a semiconductor device of the present invention, FIG. 13(b) is a sectional view of a positioning pattern of the eleventh embodiment of the semiconductor device of the present invention, and FIG. 13(c) is a diagram showing a variation in light reflection amount where a light beam is scanned over the positioning pattern of the eleventh embodiment of the semiconductor device of the present invention. The light reflection amount is a value where scan is performed along a direction of an A-A' line in FIG. 13(a). The laser trimming positioning pattern 401 in the eleventh embodiment of the present invention is provided at an intersection of vertical and horizontal scribe line areas 203 as shown in FIG. 1(a), and has a continuous structure having both so-called a theta mark function for performing comparatively rough positioning in a rotating direction of the wafer and a functions of an X-direction trimming mark and a Y-direction trimming mark to accurately position one by one semiconductor integrated circuit chips 201. The shape of the laser trimming positioning pattern 401 is desirably a featured form different from the pad areas 202 in the semiconductor integrated circuit chip 201 so that image recognition can be automatically performed. Accordingly, the example of FIG. 13(a) was formed in a cross shape.

Now explanation will be made on a sectional structure of a laser trimming positioning pattern 401 according to the eleventh embodiment of the present invention, using FIG. 13(b).

A first insulating film 102 of a silicon oxide film or the like is formed on a silicon substrate 101, and a dotted-form polysilicon thin film 103 is partly formed on the first insulation film 102. A flat first insulation film 102 is exposed at areas that no polysilicon thin film 103 is formed. An aluminum film 105 is formed on this. The surface of the aluminum film 105, located above the area formed with the dotted-form polysilicon thin film 103, is roughened by the effect of the polysilicon thin film 103 pattern. The light irradiated onto this portion is diffusely reflected. Consequently, it is possible to provide this region as the low light reflectivity region 107. On the other hand, the surface of the aluminum film 105 is flat at areas where no polysilicon thin film 103 is formed, providing for a high reflectivity area 106.

The light reflection amount where a light beam is scanned in a direction of a line A-A' in FIG. 13(a) is great in the high light reflectivity region 106 formed by the aluminum film 105 with the flat surface, and small in the low reflection region 107 formed by the aluminum film 105 with the roughened surface, as shown in FIG. 13(c). In the example of FIGS. 13(a), (b) and (c), the low light reflectivity region 107 was formed by utilizing the light diffused reflection effect. In order to cause light diffused reflection, a dotted-form pattern was formed by the polysilicon thin film 103 that is the same thin film as fuse elements. It is possible to cause light diffused reflection by a pattern of a lattice form or stripe form other than the dotted form, obtaining a light reflection pattern as in FIG. 13(c).

A second insulation film may be formed on the first insulation film 102 or the polysilicon thin film 103 in FIG. 13(b), as the case may be. Also, in place of the aluminum film 105 a metal material such as tungsten, chromium and gold may be used as the high reflectivity film.

As stated above, the high light reflectivity region 106 and the low light reflectivity region 107 have a boundary that is determined by a pattern of the polysilicon thin film 103 as the same thin film material as fuse elements. This therefore eliminates the problem, as encountered in the conventional positioning pattern, due to misalignment between the polysilicon for forming fuse element and the aluminum pattern for forming a positioning pattern.

Also, a laser trimming positioning pattern 401 is positioned at an intersection of vertical and horizontal scribe line areas 203, and formed in a continuous structure having both so-called a theta mark function for performing comparatively rough positioning in a rotating direction of the wafer and a trimming mark function for performing accurate positioning, in the X and Y directions, on each of repeatedly arranged semiconductor integrated circuit chips 201. Accordingly, it is possible to reduce the area of the laser trimming positioning pattern occupied in the scribe line area 203.

Figure 15A:
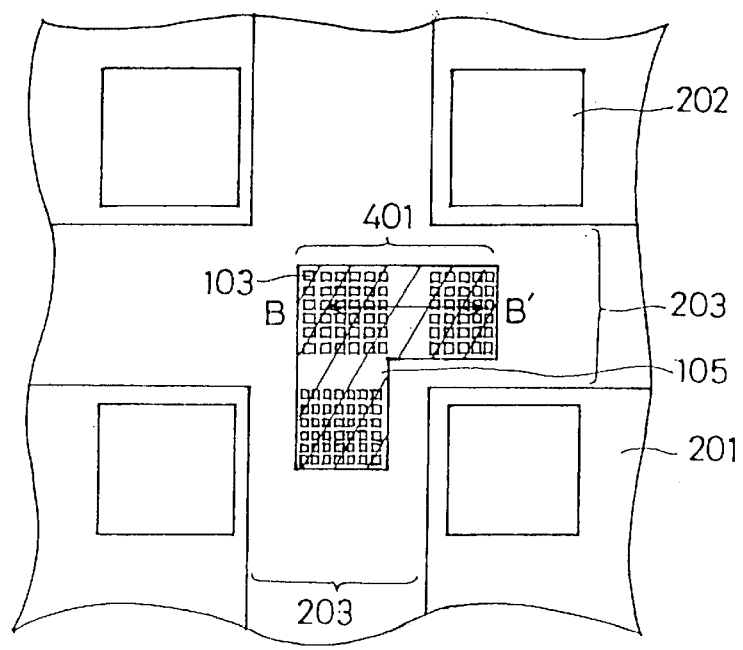
FIG. 15(a) is a plan view of a laser trimming positioning pattern of a twelfth embodiment of a semiconductor device of the present invention.
Figure 15B:
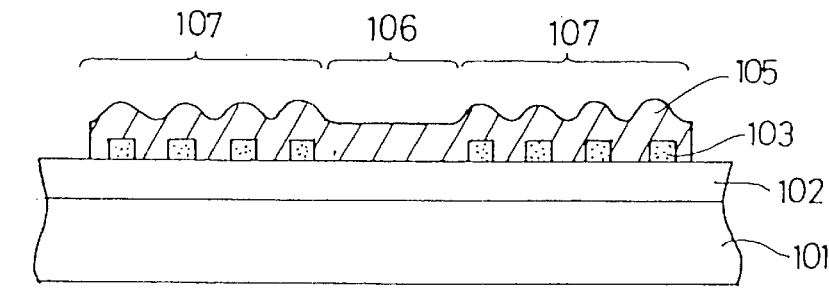
FIG. 15(b) is a sectional view of the laser trimming positioning pattern of the twelfth embodiment of the semiconductor device of the present invention.
Figure 15C:
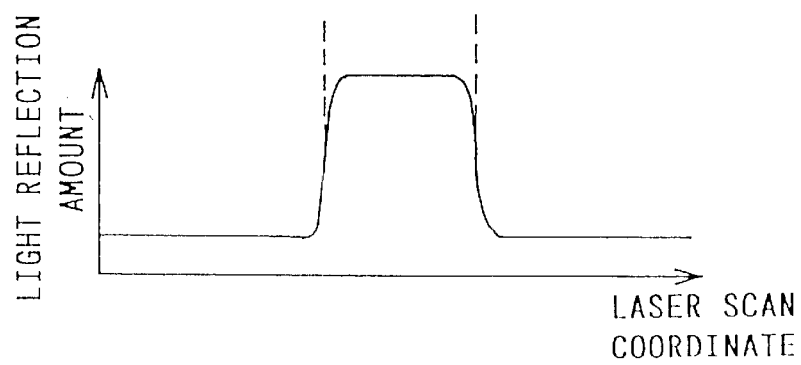
FIG. 15(c) is a diagram showing a light reflection amount along a B–B' line in FIG. 15(a).

FIG. 15(*a*) is a plan view of a positioning pattern according to a twelfth embodiment of a semiconductor device of the present invention. FIG. 15(*b*) is a sectional view of the positioning pattern of the according to the twelfth embodiment of the semiconductor device of the present invention, and FIG. 15(*c*) is a diagram showing a variation in light reflection amount where a light beam is scanned over the positioning pattern according to the twelfth embodiment of the semiconductor device of the present invention. The light reflection amount is a value where scan is performed along a direction of an B–B' line in FIG. 15(*a*).

The laser trimming position pattern 401 in the twelfth embodiment of the present invention is provided at an intersection of vertical and horizontal scribe line areas 203, similarly to the eleventh embodiment shown in FIGS. 13(*a*) to (*c*).

The difference from the eleventh embodiment lies in that the high light reflectivity region 106 is structured sandwiched by the low reflection regions 107 and that the shape of the laser trimming positioning pattern 401 is in a key form with respect to the cross form in the eleventh embodiment shown in FIG. 13.

The laser trimming positioning pattern may be in a form that either one of the high light reflectivity region 106 or the low light reflectivity region 107 is sandwiched by the other areas. The twelfth embodiment shown in FIGS. 15(*a*) to (*c*) shows the case that the arrangement is reverse to the eleventh embodiment shown in FIGS. 13(*a*) to (*c*), which shows that such a structure is satisfactorily possible. Also, the shape of the laser trimming positioning pattern 401 may be in a featured form different from the pad areas 202 and the like in the semiconductor integrated circuit chip 201 so that image recognition can be automatically carried out. Although the example of FIG. 15(*a*) is in the key form, there is no limitation to the forms shown in FIG. 13(*a*) and FIG. 15(*a*).

Other explanations will be omitted by putting the same reference characters f FIGS. 13(*a*) to (*c*).

Figure 16A:
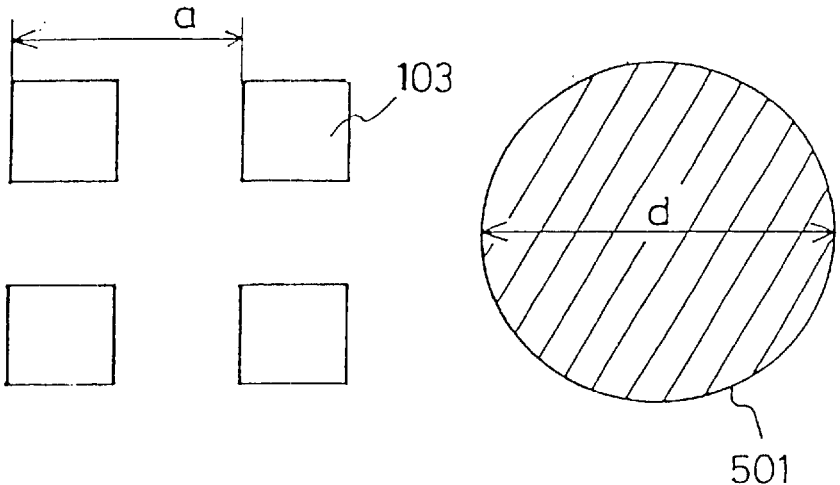
FIG. 16(a) is a typical plan view representing a part of a laser trimming positioning pattern according to the present invention and a laser beam spot.
Figure 16B:
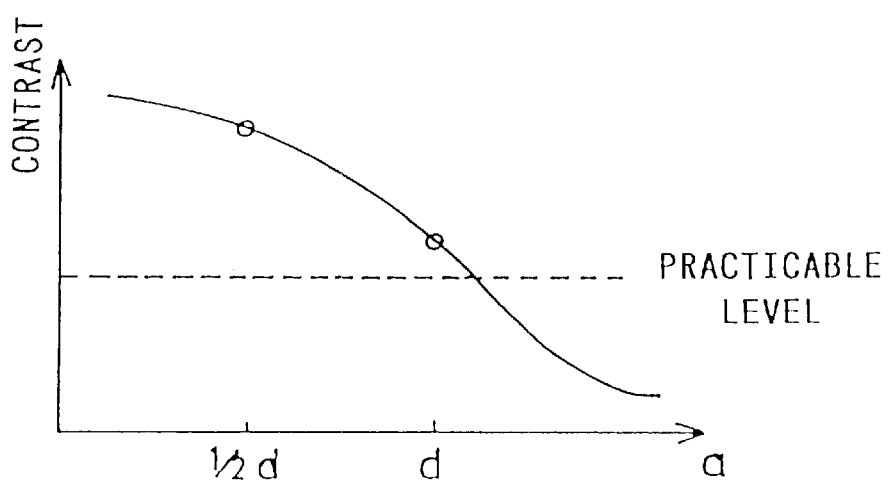
FIG. 16(b) is a view representing a contrast as a difference between the high light reflectivity region light reflection amount and the low light reflectivity region light reflection amount, and a line-and-space dimension a for one dot polysilicon thin film.

FIG. 16(*a*) is a typical plan view representing a part of a laser trimming positioning pattern according to the present invention and a laser beam.

In FIG. 16(*a*) a represents a dimension of a line-and-space of a set of dotted-form polysilicon thin films 103 (the sum of a dimension of a dot of a same material as the fuse element and a dimension of a part where no dot is formed).

Also, d shows a diameter of a laser beam spot 501.

FIG. 16(*b*) is a diagram showing a relationship between the contrast as a difference in light reflection amount between the high light reflectivity region and the low light reflectivity region and a line-and-space dimension a for one set dot polysilicon thin film 103.

The contrast improves as decreases the line-and-space dimension a (or the distance between leading edges of the adjacent lines) for one set dot polysilicon thin film 103. Considering the diameter d of a laser beam spot 501 as an index, the contrast is practicably available if the line-and-space dimension a for one set dot polysilicon thin film 103 is smaller than the laser beam spot diameter d. However, in order to obtain a higher contrast, the line-and-space dimension a for one set dot polysilicon thin film 103 is preferably smaller than a half of the laser beam spot diameter d. Although in FIG. 16 explanation was on the case of the dotted-form polysilicon thin film 103, the above is true for a lattice-form or stripe-form pattern. For a stripe-form pattern for example, the dimension a explained in FIG. 16 may be replaced by a sum of a shorter side of a polysilicon thin film 103 on one line and a gap to the adjacent polysilicon thin film 103 on the same line.

Figure 17A:
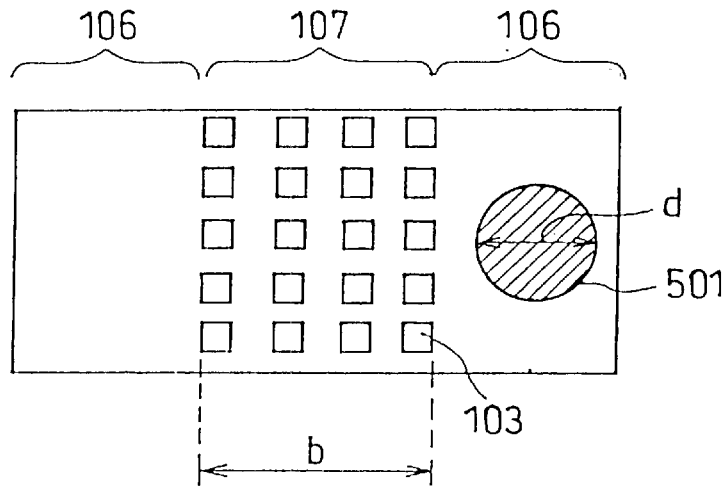
FIG. 17(a) is a typical plan view representing a part of a laser trimming positioning pattern according to the present invention and a laser beam spot.
Figure 17B:
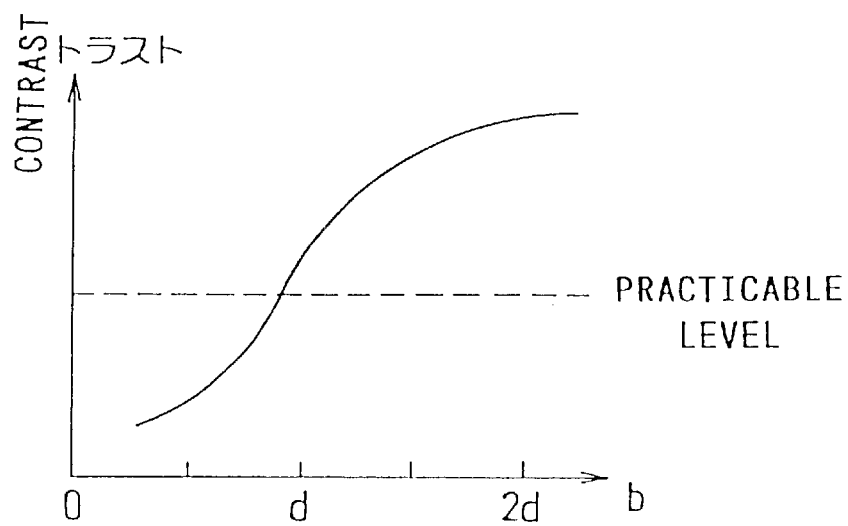
FIG. 17(b) is a view representing a contrast as a difference between the high light reflectivity region light reflection amount and the low light reflectivity region light reflection amount, and a dimension b in the laser scan direction of the low light reflectivity region.

FIG. 17(*a*) is a typical plan view depicting one part of a laser beam trimming pattern according to the invention and a laser beam.

In FIG. 17(*a*), b represents a dimension in a laser scan direction of a low light reflectivity region 107, while d shows a laser beam spot diameter.

FIG. 17(*b*) is a diagram showing a relationship of between a contrast, as a difference in light reflection amount between the high light reflectivity region 106 and the high light reflectivity region 107, and a dimension in a laser scan direction of the low light reflectivity region 107.

The contrast increases with the increase in the dimension b of the low light reflectivity region 107 in the laser scan direction. Considering as an index the diameter d of the laser beam spot 501, the contrast is practicably available where b is almost greater than b. In order to obtain a higher contrast, b is preferably of a dimension twice d. Although in FIG. 17 the dotted-form case was explained, the above is true for a case that the low light reflectivity region 107 is formed in a lattice-form or stripe-form pattern.

Also, explanation in FIG. 17 was on the case that the low light reflectivity region 107 is sandwiched by the high light reflectivity region 106. For a case that the high light reflectivity region 106 is sandwiched by the low light reflectivity regions 107 as was explained in the FIG. 2 example, the application of b explained in FIG. 17 to a dimension of a high light reflectivity region 106 will provide similar results.

Also, it is possible to apply to each of the above-stated first to twelfth embodiments of the invention the preferred dimensional relationship between the line-and-space dimension a for one-dot polysilicon thin film 103 and the diameter d of the laser beam spot 501 as well as the preferred dimensional relationship between the dimension b in the laser scan direction of the low light reflectivity region 107 and the laser beam spot 501 diameter d, in the laser trimming positioning pattern of the invention as was explained using FIG. 16 and FIG. 17.

Figure 18:
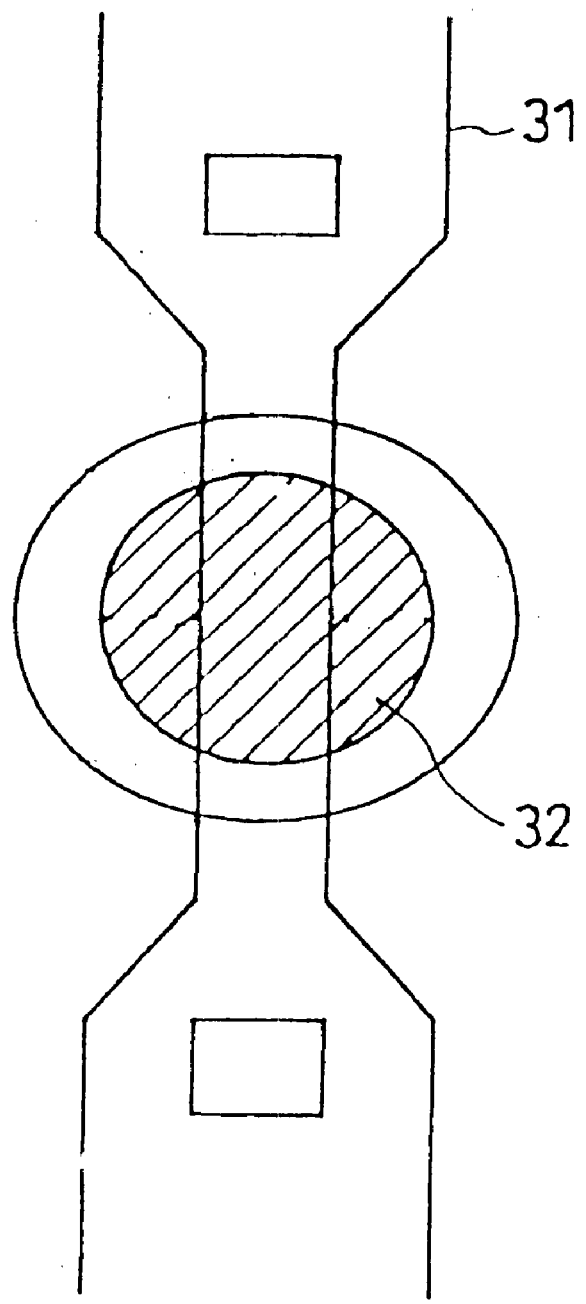
FIG. 18 is a plan view of a fuse element of a conventional semiconductor device.

FIG. 18 is a plan view of a fuse element being laser-trimmed using a positioning pattern of the invention. The laser spot 32 can be irradiated at a center of the fuse element 31.

Figure 19:
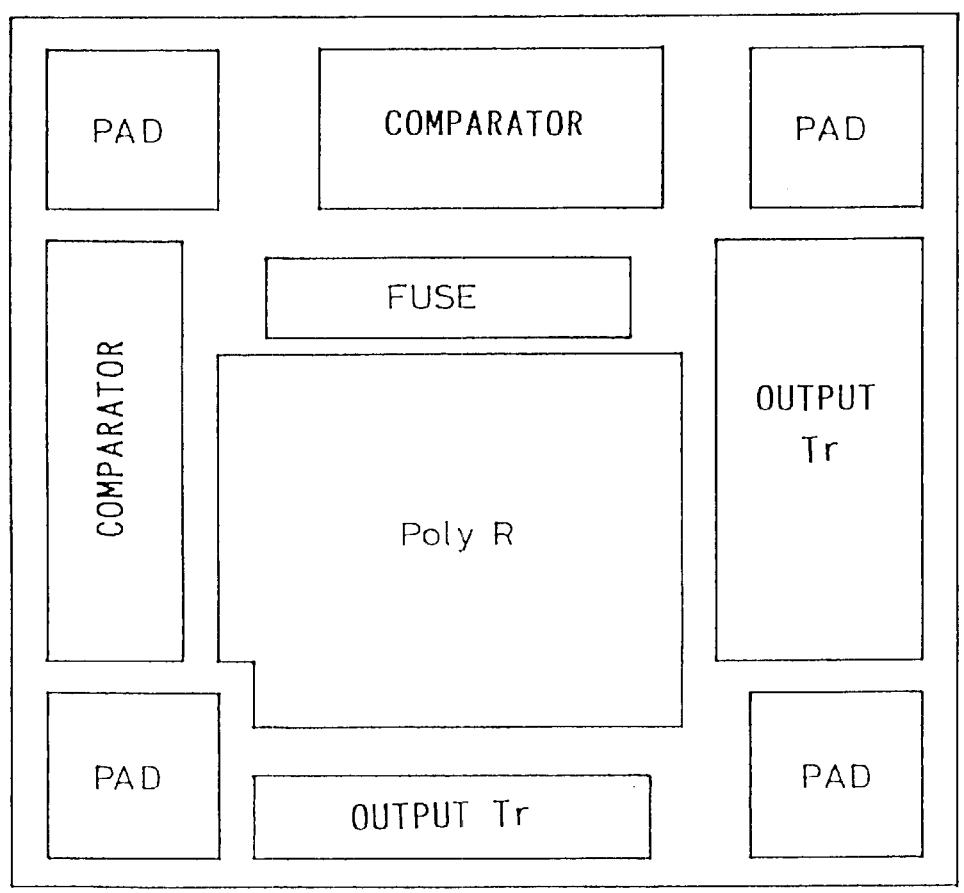
FIG. 19 is a block diagram of a semiconductor device of the present invention.

The semiconductor device according to the present invention is quite suited for a semiconductor integrated circuit comprising semiconductor elements involving significant variation. For example, FIG. 19 is a block diagram of a voltage-detecting IC formed by MOS transistors with high breakdown strength. The MOSIC involves significant variation as compared with the bipolar IC. For particularly high breakdown strength characteristics, because the gate dielectric film is made thick, variation in the analog characteristic becomes greater. Consequently, for the analog MOSIC a large area for the fuse elements is required as shown in FIG. 19. By the provision of 10 or more fuse elements, an analog characteristic with reduced variation is obtainable.

By using the laser trimming positioning pattern of the present invention, the fuse element occupying area can be reduced for the voltage detecting IC as shown in FIG. 10, thereby achieving the entire-IC area reduction. Although not shown, the laser trimming positioning pattern according to the present invention, if applied to a series regulator IC, a switching regulator IC, a lithium battery protection IC and the like, provides similar effects. Also, because the laser trimming positioning accuracy improves, it is possible to place at two or more locations the fuse elements used in these ICs by planarly differing the arrangement direction.

The positioning pattern of the present invention can be implemented by providing it on any of the scribe line area or a TEG chip or semiconductor integrated circuit chip. Where arranged in a scribe line area or a TEG chip, the effect is offered for reducing the semiconductor integrated circuit chip area.

Also, the preset invention, though suited for analog MOSICs, can be used for digital ICs. The invention is suited for high density analog bipolar ICs with extremely low variation.

The embodiments discussed so far were explained on the cases that the fuse elements for laser trimming are formed by a polysilicon thin film. The present invention is not limited to the polysilicon thin film. The low light reflectivity region 107 may be formed as a pattern of a dotted form or the like to cause light diffused reflection by using a thin film same as the thin film forming laser-trimming fuse elements.

The laser trimming positioning pattern has a boundary between the high light reflectivity region and the low reflectivity region, i.e., the area having a light reflectivity abruptly varies, which can be defined by a pattern formed by a thin film same as a laser trimming fuse element. Further, showing was made for the preferred relationship between the inner dimension of the laser trimming positioning pattern and the laser beam spot diameter. This provides the following effects.

(1) The fuse elements can be cut stably.

(2) In ICs requiring a plurality of fuse elements, the fuse elements area can be formed small.

(3) In ICs requiring a plurality fuse elements, it is possible to design fuse element areas at two or more locations in different directions.

Also, the laser trimming positioning pattern according to the present invention can be formed in existing pad areas within a semiconductor integrated circuit chip, or placed at intersections between the scribe lines as a continuous structure used both as a theta mark function for comparatively rough positioning with respect to a semiconductor wafer rotating direction and as a trimming mark function for accurately positioning one by one semiconductor integrated circuits placed in repetition.

This provides the following effects.

(4) In cutting (dicing process) into semiconductor integrated circuits, the dicing cutter is less damaged to increase throughput. Further, the fear to damage the semiconductor integrated circuit is reduced.

(5) In the scribe line area, there is broadening in area where test pattern or pattern aligning marks, etc. used in the semiconductor integrated circuit forming process (so-called a first half process) are inserted, thereby enabling satisfactory process control.

What is claimed is:

1. A semiconductor device comprising: a semiconductor wafer; a plurality of semiconductor integrated circuit chips formed in the wafer and being arranged two-dimensionally in a matrix form; scribe lines formed in a surface of the semiconductor wafer for separating the semiconductor integrated circuit chips; laser-trimmable fuses formed in the semiconductor integrated circuit chips for adjusting a desired circuit characteristic; and a laser trimming positioning pattern provided on the surface of the semiconductor wafer for positioning of a laser for cutting a fuse; wherein the laser trimming positioning pattern and the fuses are formed of the same thin film.

2. A semiconductor device as recited in claim 1; wherein the laser trimming positioning pattern comprises a plurality of high light reflectivity regions and a low light reflectivity region sandwiched by the high light reflectivity regions.

3. A semiconductor device as recited in claim 1; wherein the laser trimming positioning pattern comprises a plurality of low light reflectivity regions and a high light reflectivity region sandwiched by the low light reflectivity regions.

4. A semiconductor device as recited in claim 2; wherein the low light reflectivity region has one of a dotted, a lattice or a stripe pattern for causing diffused light reflection.

5. A semiconductor device as recited in claim 3; wherein the low light reflectivity region has one of a dotted, a lattice or a stripe pattern for causing diffused light reflection.

6. A semiconductor device as recited in claim 2; wherein the fuse is formed of a polysilicon thin film.

7. A semiconductor device as recited in claim 3; wherein the fuse is formed of a polysilicon thin film.

8. A semiconductor device as recited in claim 1; wherein the laser trimming positioning pattern has a high light reflectivity region and a low light reflectivity region, the high light reflectivity region comprising a high light reflectivity film formed on a flat underlying layer, and the low light reflectivity region comprising the high light reflectivity film formed over a region having one of a dotted, a lattice or a stripe pattern for causing diffused light reflection.

9. A semiconductor device as recited in claim 8; wherein the laser trimming positioning pattern comprises a plurality of the high light reflectivity regions and the low light reflectivity region sandwiched by the high light reflectivity regions.

10. A semiconductor device as recited in claim 8; wherein the laser trimming positioning pattern comprises a plurality of the low light reflectivity regions and the high light reflectivity region sandwiched by the low light reflectivity regions.

11. A semiconductor device as recited in claim 8; wherein the fuse is formed of a polysilicon thin film.

12. A semiconductor device as recited in claim 8; wherein the high light reflectivity film is formed of aluminum.

13. A semiconductor device as recited in claim 8; wherein the laser trimming positioning pattern is formed in a pad area used for external electrical connection within the respective semiconductor integrated circuit chips.

14. A semiconductor device as recited in claim 8; wherein the laser trimming positioning pattern is formed at an intersection between the scribe lines.

15. A semiconductor device as recited in claim 8; wherein the laser trimming positioning pattern is structured by integrating with the high light reflectivity film a theta mark for comparatively rough positioning with respect to a rotating direction of the semiconductor wafer and a trimming mark for close positioning in an X direction and a Y direction in the respective semiconductor integrated circuit chips.

16. A semiconductor device as recited in claim 1; wherein the laser trimming positioning pattern comprises a thin film having one of a dotted, a lattice or a stripe pattern to form a low light reflectivity region and the distance between leading edges of adjacent lines of the pattern is smaller than a diameter of a laser beam spot of a laser beam used for positioning.

17. A semiconductor device as recited in claim 1; wherein the laser trimming positioning pattern comprises a thin film having one of a dotted, a lattice or a stripe pattern defining the low light reflectivity region, and the distance between leading edges of adjacent lines of the pattern is smaller than one-half of a diameter of a laser beam spot of a laser beam used for positioning.

18. A semiconductor device as recited in claim 2; wherein the low light reflectivity region has a size in a laser beam scan direction greater than a diameter of the laser beam spot.

19. A semiconductor device as recited in claim 3; wherein the high light reflectivity region has a size in a laser beam scan direction greater than a diameter of the laser beam spot.

20. A semiconductor device as recited in claim 2; wherein the low light reflectivity region has a size in a laser beam scan direction greater than twice the diameter of the laser beam spot.

21. A semiconductor device as recited in claim 3; wherein the high light reflectivity region has a size in a laser beam scan direction greater than twice the diameter of the laser beam spot.

22. A semiconductor device as recited in claim 8; wherein the laser trimming positioning pattern comprises a thin film having one of a dotted, a lattice or a stripe pattern defining the low light reflectivity region, and the distance between leading edges of adjacent lines of the pattern is smaller than a diameter of a laser beam spot of a laser beam used for positioning.

23. A semiconductor device as recited in claim 8; wherein the laser trimming positioning pattern comprises a thin film having one of a dotted, a lattice or a stripe pattern defining the low light reflectivity region, and the distance between leading edges of adjacent lines of the pattern is smaller than a half of a diameter of a laser beam spot of a laser beam used for positioning.

24. A semiconductor device as recited in claim 9; wherein the low light reflectivity region has a size in a laser beam scan direction greater than a diameter of a laser beam spot.

25. A semiconductor device as recited in claim 10; wherein the high light reflectivity region has a size in a laser beam scan direction greater than a diameter of a laser beam spot.

26. A semiconductor device as recited in claim 9; wherein the low light reflectivity region has a size in a laser beam scan direction greater than twice the diameter of a laser beam spot.

27. A semiconductor device as recited in claim 10; wherein the high light reflectivity region has a size in a laser beam scan direction greater than twice the diameter of a laser beam spot.

28. A semiconductor device as recited in claim 1; wherein ten or more of the fuses are provided in the respective semiconductor integrated circuit chips.

29. A semiconductor device as recited in claim 8; wherein ten or more of the fuses are provided in the respective semiconductor integrated circuit chips.

30. A semiconductor device as recited in claim 1; wherein the semiconductor integrated circuit has therein several fuse groups each facing a different direction and each being formed by at least one fuse arranged in the same direction.

31. A semiconductor device as recited in claim 8; wherein the semiconductor integrated circuit has therein several fuse groups each facing a different direction and each being formed by at least one fuse arranged in the same direction.

32. A semiconductor device as recited in claim 1; wherein the semiconductor integrated circuit is a voltage detecting IC.

33. A semiconductor device as recited in claim 1; wherein the semiconductor integrated circuit is a series regulator IC.

34. A semiconductor device as recited in claim 1; wherein the semiconductor integrated circuit is a switching regulator IC.

35. A semiconductor device as recited in claim 1; wherein the semiconductor integrated circuit is a lithium battery protecting IC.

36. A semiconductor device as recited in claim 8; wherein the semiconductor integrated circuit is a voltage detecting IC.

37. A semiconductor device as recited in claim 8; wherein the semiconductor integrated circuit is a series regulator IC.

38. A semiconductor device as recited in claim 8; wherein the semiconductor integrated circuit is a switching regulator IC.

39. A semiconductor device as recited in claim 8; wherein the semiconductor integrated circuit is a lithium battery protecting IC.

40. A semiconductor device as recited in claim 1; wherein the laser trimming positioning pattern has a high light reflectivity region and a low light reflectivity region, the high light reflectivity region comprising a thin film having a flat surface, and the low light reflectivity region comprising the thin film formed with one of a dotted, a lattice or a stripe pattern for causing diffused light reflection.

41. A semiconductor device as recited in claim 1; wherein the thin film is formed of polysilicon.

42. A semiconductor device as recited in claim 41; further comprising a metal film formed over the polysilicon thin film of the laser trimming positioning pattern.

43. A semiconductor device as recited in claim 42; further comprising an insulating film disposed between the polysilicon film and the metal film.

44. A semiconductor device as recited in claim 1; wherein the thin film is formed of polysilicon.

45. A semiconductor device as recited in claim 1; wherein the laser trimming positioning pattern comprises the thin film patterned to form a first region comprising a continuous film region having a comparatively high light reflectivity and a second region comprising a discontinuous film region having a comparatively low light reflectivity.

46. A semiconductor device as recited in claim 45; wherein the discontinuous film region comprises a region of the thin film etched to form a plurality of lines.

47. A semiconductor device as recited in claim 45; wherein the discontinuous film region comprises a region of the thin film etched to form one of a dotted, a lattice, or a striped pattern.

48. A semiconductor device as recited in claim 8; wherein the low light reflectivity region further comprises a polysilicon film having one of the dotted, lattice or stripe pattern formed between the high reflectivity film and the wafer so that the high reflectivity film causes diffused light reflection.

49. An integrated circuit formed on a substrate and having a thin film trimmable fuse and a trimming positioning pattern for positioning a cutting beam for cutting the fuse, the trimming positioning pattern comprising: a thin film formed on the substrate and having a flat region comprising a continuous film area, and a patterned region having a plurality of film areas each being smaller than the continuous film area of the flat region, the flat region and the patterned region having a higher reflective property than areas therebetween; wherein the thin film forming the trimmable fuse is the same thin film forming the positioning pattern mark.

50. An integrated circuit according to claim 49; wherein the trimming positioning pattern further comprises a metal film formed over the thin film.

51. An integrated circuit according to claim 49; wherein the patterned region comprises the thin film patterned with one of a dotted, a lattice or a stripe pattern for causing diffused light reflection.

52. An integrated circuit formed on a substrate and having a thin film trimmable fuse and a trimming positioning pattern for positioning a cutting beam for cutting the fuse, the trimming positioning pattern comprising: a patterned thin film formed on the substrate and having a plurality of film areas; and a flat region adjacent the patterned thin film and having a higher reflective property than the patterned thin film; wherein the thin film forming the fuse is the same thin film used to form the trimming positioning pattern.

53. An integrated circuit according to claim 52; wherein the trimming positioning pattern further comprises a metal film formed over the thin film.

54. An integrated circuit according to claim 53; further comprising an insulating film formed between the metal film and the thin film.

55. An integrated circuit according to claim 52; wherein the patterned thin film has one of a dotted, a lattice or a stripe pattern for causing diffused light reflection.

56. A semiconductor device comprising: a plurality of semiconductor integrated circuit chips two-dimensionally arranged in a matrix form in a wafer; scribe lines formed in the wafer for separating the chips; laser-trimmable fuses formed of a polysilicon thin film in the wafer for adjusting a desired circuit characteristic; and a laser trimming positioning pattern provided on the surface of the semiconductor wafer for positioning of a laser for cutting a fuse; wherein the laser trimming positioning pattern comprises a polysilicon thin film and has a flat area forming a high light reflection region and a patterned area having one of a dot or stripe pattern forming a diffused light reflection region and an aluminum film covering the flat area and the patterned area.

\* \* \* \* \*